(12) United States Patent
Hosaka et al.

(10) Patent No.: US 12,210,257 B2
(45) Date of Patent: Jan. 28, 2025

(54) DISPLAY DEVICE AND ELECTRONIC DEVICE INCLUDING THE DISPLAY DEVICE

(71) Applicant: SEMICONDUCTOR ENERGY LABORATORY CO., LTD., Atsugi (JP)

(72) Inventors: Yasuharu Hosaka, Tochigi (JP); Yukinori Shima, Gunma (JP); Kenichi Okazaki, Tochigi (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/415,901

(22) Filed: Jan. 18, 2024

(65) Prior Publication Data
US 2024/0152012 A1 May 9, 2024

Related U.S. Application Data

(63) Continuation of application No. 17/994,525, filed on Nov. 28, 2022, now Pat. No. 11,899,328, which is a
(Continued)

(30) Foreign Application Priority Data
Jul. 20, 2012 (JP) ................. 2012-161344

(51) Int. Cl.
*G02F 1/1368* (2006.01)
*G02F 1/1333* (2006.01)
(Continued)

(52) U.S. Cl.
CPC ...... *G02F 1/1368* (2013.01); *G02F 1/133345* (2013.01); *G02F 1/133512* (2013.01);
(Continued)

(58) Field of Classification Search
None
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 001450665 A | 10/2003 |
| CN | 001458640 A | 11/2003 |

(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
(Continued)

*Primary Examiner* — Richard H Kim
(74) *Attorney, Agent, or Firm* — Fish & Richardson P.C.

(57) ABSTRACT

The display device includes a first substrate provided with a driver circuit region that is located outside and adjacent to a pixel region and includes at least one second transistor which supplies a signal to the first transistor in each of the pixels in the pixel region, a second substrate facing the first substrate, a liquid crystal layer between the first substrate and the second substrate, a first interlayer insulating film including an inorganic insulating material over the first transistor and the second transistor, a second interlayer insulating film including an organic insulating material over the first interlayer insulating film, and a third interlayer insulating film including an inorganic insulating material over the second interlayer insulating film. The third interlayer insulating film is provided in part of an upper region
(Continued)

of the pixel region, and has an edge portion on an inner side than the driver circuit region.

19 Claims, 11 Drawing Sheets

Related U.S. Application Data continuation of application No. 17/562,070, filed on Dec. 27, 2021, now Pat. No. 11,531,243, which is a continuation of application No. 16/720,439, filed on Dec. 19, 2019, now Pat. No. 11,209,710, which is a continuation of application No. 16/175,021, filed on Oct. 30, 2018, now Pat. No. 10,514,580, which is a continuation of application No. 15/012,092, filed on Feb. 1, 2016, now Pat. No. 10,514,579, which is a continuation of application No. 13/939,323, filed on Jul. 11, 2013, now Pat. No. 9,298,057.

(51) Int. Cl.
G02F 1/1335 (2006.01)
G02F 1/1337 (2006.01)
G02F 1/1345 (2006.01)
G02F 1/1362 (2006.01)
H01L 27/12 (2006.01)

(52) U.S. Cl.
CPC ........ *G02F 1/1337* (2013.01); *G02F 1/13454* (2013.01); *G02F 1/136227* (2013.01); *H01L 27/1214* (2013.01); *H01L 27/1225* (2013.01); *H01L 27/1248* (2013.01)

(56) References Cited

U.S. PATENT DOCUMENTS

| | | |
|---|---|---|
| 5,892,562 A | 4/1999 | Yamazaki et al. |
| 6,043,000 A | 3/2000 | Park et al. |
| 6,294,274 B1 | 9/2001 | Kawazoe et al. |
| 6,395,457 B1 | 5/2002 | Park et al. |
| 6,498,369 B1 | 12/2002 | Yamazaki et al. |
| 6,563,174 B2 | 5/2003 | Kawasaki et al. |
| 6,576,924 B1 | 6/2003 | Yamazaki et al. |
| 6,576,926 B1 | 6/2003 | Yamazaki et al. |
| 6,646,288 B2 | 11/2003 | Yamazaki et al. |
| 6,727,522 B1 | 4/2004 | Kawasaki et al. |
| 6,861,710 B2 | 3/2005 | Murakami et al. |
| 6,960,786 B2 | 11/2005 | Yamazaki et al. |
| 6,967,129 B2 | 11/2005 | Yamazaki et al. |
| 6,992,332 B2 | 1/2006 | Yamazaki et al. |
| 7,033,848 B2 | 4/2006 | Murakami et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,122,830 B2 | 10/2006 | Ishikawa et al. |
| 7,211,825 B2 | 5/2007 | Shih et al. |
| 7,282,782 B2 | 10/2007 | Hoffman et al. |
| 7,288,789 B2 | 10/2007 | Yamazaki et al. |
| 7,297,977 B2 | 11/2007 | Hoffman et al. |
| 7,323,356 B2 | 1/2008 | Hosono et al. |
| 7,365,393 B2 | 4/2008 | Yamazaki et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,442,991 B2 | 10/2008 | Yamazaki et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,486,368 B2 | 2/2009 | Sakakura et al. |
| 7,492,012 B2 | 2/2009 | Murakami et al. |
| 7,501,293 B2 | 3/2009 | Ito et al. |
| 7,508,004 B2 | 3/2009 | Ishiguro |
| 7,554,116 B2 | 6/2009 | Yamazaki et al. |
| 7,557,982 B2 | 7/2009 | Shoji et al. |
| 7,583,336 B2 | 9/2009 | Ahn |
| 7,671,369 B2 | 3/2010 | Yamazaki et al. |
| 7,674,650 B2 | 3/2010 | Akimoto et al. |
| 7,696,529 B2 | 4/2010 | Choo et al. |
| 7,723,179 B2 | 5/2010 | Yamazaki et al. |
| 7,732,819 B2 | 6/2010 | Akimoto et al. |
| 7,745,829 B2 | 6/2010 | Yamazaki et al. |
| 7,760,309 B2 | 7/2010 | Ahn et al. |
| 7,791,072 B2 | 9/2010 | Kumomi et al. |
| 7,796,101 B2 | 9/2010 | Iwashita et al. |
| 7,859,510 B2 | 12/2010 | Umezaki |
| 7,910,490 B2 | 3/2011 | Akimoto et al. |
| 7,932,521 B2 | 4/2011 | Akimoto et al. |
| 7,982,389 B2 | 7/2011 | Ishiguro |
| 7,989,808 B2 | 8/2011 | Yamazaki et al. |
| 8,008,666 B2 | 8/2011 | Yamazaki et al. |
| 8,030,659 B2 | 10/2011 | Yamazaki et al. |
| 8,059,067 B2 | 11/2011 | Iwashita et al. |
| 8,115,206 B2 | 2/2012 | Sakakura et al. |
| 8,115,883 B2 | 2/2012 | Yamazaki et al. |
| 8,115,893 B2 | 2/2012 | Jung et al. |
| 8,207,537 B2 | 6/2012 | Yamazaki et al. |
| 8,217,396 B2 | 7/2012 | Yamazaki et al. |
| 8,237,166 B2 | 8/2012 | Kumomi et al. |
| 8,269,218 B2 | 9/2012 | Yamazaki |
| 8,274,077 B2 | 9/2012 | Akimoto et al. |
| 8,274,079 B2 | 9/2012 | Yamazaki |
| 8,319,209 B2 | 11/2012 | Takei |
| 8,350,466 B2 | 1/2013 | Murakami et al. |
| 8,378,343 B2 | 2/2013 | Yamazaki et al. |
| 8,382,545 B2 | 2/2013 | Sakakura et al. |
| 8,399,182 B2 | 3/2013 | Lim et al. |
| 8,405,092 B2 | 3/2013 | Inoue et al. |
| 8,415,669 B2 | 4/2013 | Yamazaki et al. |
| 8,466,463 B2 | 6/2013 | Akimoto et al. |
| 8,471,259 B2 | 6/2013 | Yamazaki et al. |
| 8,471,262 B2 | 6/2013 | Yamazaki et al. |
| 8,488,077 B2 | 7/2013 | Yamazaki et al. |
| 8,546,180 B2 | 10/2013 | Yamazaki et al. |
| 8,558,241 B2 | 10/2013 | Yamazaki et al. |
| 8,575,619 B2 | 11/2013 | Yamazaki et al. |
| 8,610,120 B2 | 12/2013 | Miyake et al. |
| 8,629,069 B2 | 1/2014 | Akimoto et al. |
| 8,654,272 B2 | 2/2014 | Yamazaki et al. |
| 8,669,550 B2 | 3/2014 | Akimoto et al. |
| 8,674,354 B2 | 3/2014 | Yamazaki |
| 8,698,970 B2 | 4/2014 | Yamazaki et al. |
| 8,704,962 B2 | 4/2014 | Oh et al. |
| 8,785,241 B2 | 7/2014 | Sasagawa et al. |
| 8,790,959 B2 | 7/2014 | Akimoto et al. |
| 8,796,069 B2 | 8/2014 | Akimoto et al. |
| 8,822,990 B2 | 9/2014 | Yamazaki et al. |
| 8,823,009 B2 | 9/2014 | Yamazaki et al. |
| 8,823,892 B2 | 9/2014 | Kim et al. |
| 8,829,527 B2 | 9/2014 | Yamazaki et al. |
| 8,866,984 B2 | 10/2014 | Yamazaki |
| 8,878,180 B2 | 11/2014 | Yamazaki |
| 8,878,185 B2 | 11/2014 | Ishigaki et al. |
| 8,879,011 B2 | 11/2014 | Yamazaki et al. |
| 8,885,115 B2 | 11/2014 | Yamazaki et al. |
| 8,901,806 B2 | 12/2014 | Sakakura et al. |
| 8,988,623 B2 | 3/2015 | Koyama et al. |
| 8,994,889 B2 | 3/2015 | Yamazaki et al. |
| 9,099,562 B2 | 8/2015 | Akimoto et al. |
| 9,117,732 B2 | 8/2015 | Yamazaki |
| 9,136,389 B2 | 9/2015 | Yamazaki et al. |
| 9,153,602 B2 | 10/2015 | Yamazaki et al. |
| 9,202,923 B2 | 12/2015 | Yamazaki |
| 9,224,870 B2 | 12/2015 | Yamazaki et al. |
| 9,257,670 B2 | 2/2016 | Sakakura et al. |
| 9,293,601 B2 | 3/2016 | Yamazaki et al. |
| 9,379,136 B2 | 6/2016 | Sasagawa et al. |
| 9,431,431 B2 | 8/2016 | Yamazaki et al. |
| 9,444,069 B2 | 9/2016 | Murakami et al. |
| 9,488,890 B2 | 11/2016 | Koyama et al. |
| 9,508,953 B2 | 11/2016 | Sakakura et al. |

(56) References Cited

U.S. PATENT DOCUMENTS

| | | |
|---|---|---|
| 9,728,555 B2 | 8/2017 | Yamazaki |
| 9,910,334 B2 | 3/2018 | Yamazaki et al. |
| 9,991,288 B2 | 6/2018 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0163035 A1 | 11/2002 | Yamazaki |
| 2003/0127651 A1 | 7/2003 | Murakami et al. |
| 2003/0189210 A1 | 10/2003 | Yamazaki et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0113142 A1 | 6/2004 | Ishikawa et al. |
| 2004/0127038 A1 | 7/2004 | Carcia et al. |
| 2005/0017302 A1 | 1/2005 | Hoffman |
| 2005/0041191 A1 | 2/2005 | Lim |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0166895 A1 | 7/2007 | Lee |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0036705 A1 | 2/2008 | Iwashita et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0198319 A1 | 8/2008 | Kim et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308805 A1 | 12/2008 | Akimoto et al. |
| 2009/0046230 A1 | 2/2009 | Sakurai et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0261337 A1 | 10/2009 | Sakakura et al. |
| 2009/0278122 A1 | 11/2009 | Hosono et al. |
| 2009/0280600 A1 | 11/2009 | Hosono et al. |
| 2010/0065841 A1 | 3/2010 | Lee et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117991 A1 | 5/2010 | Koyama et al. |
| 2010/0295041 A1 | 11/2010 | Kumomi et al. |
| 2011/0070399 A1 | 3/2011 | Sunohara |
| 2011/0084272 A1 | 4/2011 | Miyanaga et al. |
| 2011/0102697 A1 | 5/2011 | Koyama et al. |
| 2011/0104851 A1 | 5/2011 | Akimoto et al. |
| 2011/0109351 A1 | 5/2011 | Yamazaki et al. |
| 2011/0121290 A1 | 5/2011 | Akimoto et al. |
| 2011/0133181 A1 | 6/2011 | Yamazaki |
| 2011/0157252 A1 | 6/2011 | Yamazaki et al. |
| 2011/0157254 A1 | 6/2011 | Yamazaki et al. |
| 2011/0198598 A1 | 8/2011 | Kim et al. |
| 2011/0204368 A1 | 8/2011 | Tsubuku et al. |
| 2011/0212569 A1 | 9/2011 | Yamazaki et al. |
| 2011/0242476 A1 | 10/2011 | Moriwaki et al. |
| 2011/0291096 A1 | 12/2011 | Ryoo et al. |
| 2012/0013817 A1 | 1/2012 | Kim et al. |
| 2012/0061666 A1 | 3/2012 | Inoue et al. |
| 2012/0097940 A1 | 4/2012 | Kwon et al. |
| 2012/0105778 A1 | 5/2012 | Fujiyoshi et al. |
| 2012/0132919 A1 | 5/2012 | Sakakura et al. |
| 2012/0153292 A1 | 6/2012 | Nakamura et al. |
| 2012/0175625 A1 | 7/2012 | Yamazaki |
| 2012/0319118 A1 | 12/2012 | Yamazaki |
| 2013/0168670 A1 | 7/2013 | Inoue et al. |
| 2013/0221361 A1 | 8/2013 | Yamazaki et al. |
| 2014/0016056 A1 | 1/2014 | Miyake et al. |
| 2014/0022480 A1 | 1/2014 | Yokoyama et al. |
| 2014/0332819 A1 | 11/2014 | Yamazaki et al. |
| 2015/0179675 A1 | 6/2015 | Yamazaki et al. |
| 2015/0303072 A1 | 10/2015 | Yamazaki et al. |
| 2015/0340513 A1 | 11/2015 | Akimoto et al. |
| 2015/0364501 A1 | 12/2015 | Yamazaki |
| 2015/0364502 A1 | 12/2015 | Yamazaki et al. |
| 2016/0147099 A1 | 5/2016 | Hosaka et al. |
| 2016/0300933 A1 | 10/2016 | Sasagawa et al. |
| 2017/0059909 A1 | 3/2017 | Koyama et al. |
| 2017/0069872 A1 | 3/2017 | Murakami et al. |
| 2018/0211980 A1 | 7/2018 | Yamazaki |

FOREIGN PATENT DOCUMENTS

| | | |
|---|---|---|
| CN | 001578546 A | 2/2005 |
| CN | 001728900 A | 2/2006 |
| CN | 001750719 A | 3/2006 |
| CN | 001941299 A | 4/2007 |
| CN | 101038932 A | 9/2007 |
| CN | 101114100 A | 1/2008 |
| CN | 101335293 A | 12/2008 |
| CN | 101673758 A | 3/2010 |
| CN | 101800240 A | 8/2010 |
| CN | 101997036 A | 3/2011 |
| CN | 102540603 A | 7/2012 |
| CN | 102593185 A | 7/2012 |
| EP | 1028469 A | 8/2000 |
| EP | 1031873 A | 8/2000 |
| EP | 1045447 A | 10/2000 |
| EP | 1492390 A | 12/2004 |
| EP | 1737044 A | 12/2006 |
| EP | 1770788 A | 4/2007 |
| EP | 1808898 A | 7/2007 |
| EP | 1835540 A | 9/2007 |
| EP | 1887417 A | 2/2008 |
| EP | 1995787 A | 11/2008 |
| EP | 1998373 A | 12/2008 |
| EP | 1998374 A | 12/2008 |

(56) References Cited

FOREIGN PATENT DOCUMENTS

| | | |
|---|---|---|
| EP | 1998375 A | 12/2008 |
| EP | 2154719 A | 2/2010 |
| EP | 2226847 A | 9/2010 |
| EP | 2284605 A | 2/2011 |
| EP | 2284891 A | 2/2011 |
| EP | 2407823 A | 1/2012 |
| EP | 2410567 A | 1/2012 |
| EP | 2466365 A | 6/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-048668 A | 2/1998 |
| JP | 10-062818 A | 3/1998 |
| JP | 10-096960 A | 4/1998 |
| JP | 11-505377 | 5/1999 |
| JP | 2000-044236 A | 2/2000 |
| JP | 2000-150900 A | 5/2000 |
| JP | 2000-299468 A | 10/2000 |
| JP | 2000-356788 A | 12/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-197367 A | 7/2003 |
| JP | 2003-302917 A | 10/2003 |
| JP | 2004-103957 A | 4/2004 |
| JP | 2004-273614 A | 9/2004 |
| JP | 2004-273732 A | 9/2004 |
| JP | 2005-173106 A | 6/2005 |
| JP | 2006-165528 A | 6/2006 |
| JP | 2007-053355 A | 3/2007 |
| JP | 2007-123861 A | 5/2007 |
| JP | 2007-188808 A | 7/2007 |
| JP | 2007-250244 A | 9/2007 |
| JP | 2009-237573 A | 10/2009 |
| JP | 2009-271103 A | 11/2009 |
| JP | 2010-103340 A | 5/2010 |
| JP | 2010-117549 A | 5/2010 |
| JP | 2011-049540 A | 3/2011 |
| JP | 2011-071503 A | 4/2011 |
| JP | 2011-118377 A | 6/2011 |
| JP | 2011-139047 A | 7/2011 |
| JP | 2011-154358 A | 8/2011 |
| JP | 2011-171300 A | 9/2011 |
| JP | 2011-171727 A | 9/2011 |
| JP | 2011-181913 A | 9/2011 |
| JP | 2011-192977 A | 9/2011 |
| JP | 2011-221097 A | 11/2011 |
| JP | 2012-039102 A | 2/2012 |
| JP | 2012-084864 A | 4/2012 |
| JP | 2012-128159 A | 7/2012 |
| JP | 2012-138590 A | 7/2012 |
| JP | 2012-160715 A | 8/2012 |
| KR | 2001-0006985 A | 1/2001 |
| KR | 2007-0093830 A | 9/2007 |
| KR | 2008-0035643 A | 4/2008 |
| KR | 2010-0061420 A | 6/2010 |
| KR | 2011-0094458 A | 8/2011 |
| KR | 2012-0007099 A | 1/2012 |
| KR | 2012-0067288 A | 6/2012 |
| KR | 2012-0090779 A | 8/2012 |
| KR | 2012-0138770 A | 12/2012 |
| TW | I264822 | 10/2006 |
| TW | 201214711 | 4/2012 |
| TW | 201220507 | 5/2012 |
| TW | 201230341 | 7/2012 |
| TW | 201238056 | 9/2012 |
| WO | WO-2004/114391 | 12/2004 |
| WO | WO-2007/011061 | 1/2007 |
| WO | WO-2011/007675 | 1/2011 |
| WO | WO-2011/013561 | 2/2011 |
| WO | WO-2011/052382 | 5/2011 |
| WO | WO-2011/081011 | 7/2011 |
| WO | WO-2011/089844 | 7/2011 |
| WO | WO-2011/096263 | 8/2011 |
| WO | WO-2011/102203 | 8/2011 |
| WO | WO-2012/035975 | 3/2012 |
| WO | WO-2012/035984 | 3/2012 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315, Elsevier.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178, Elsevier.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355, Elsevier.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

(56) References Cited

OTHER PUBLICATIONS

Lee.J et al., "World's Largest (15-Inch) XGA AMLCD Panel Using Igzo Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, the Japan Society of Applied Physics.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, the Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4: Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2: Distinguished Paper: World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.S et al., "Challenge to Future Displays: Transparent AM-OLED Driven by PEALD Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", Nirim Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "SPINEL, YbFe2O4, and Yb2Fe3O7 Types of Structures for Compounds inthe In2O3 and Sc2O3—A2O3—Bo Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384, Elsevier.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

(56) References Cited

OTHER PUBLICATIONS

Hsieh.H et al., "P-29: Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SiTiO3 With Sputtered Al2O3 Gate Insulator", Appl. Phys. Lett. (Applied Physics Letters) , Sep. 1, 2003, vol. 83, No. 9, pp. 1755-1757.
International Search Report (Application No. PCT/JP2013/069456) Dated Oct. 22, 2013.
Written Opinion (Application No. PCT/JP2013/069456) Dated Oct. 22, 2013.
German Office Action (Application No. 112013003609.6) Dated Jul. 29, 2016.
Chinese Office Action (Application No. 201380038678.2) Dated Aug. 2, 2016.
Taiwanese Office Action (Application No. 102125561) Dated Feb. 7, 2017.
Chinese Office Action (Application No. 201380038678.2) Dated Apr. 5, 2017.
Power of Attorney, Dated Jul. 18, 2018, p. 2.
Petition for Inter Partes Review of U.S. Pat. No. 9,298,057 B2, Dated Jul. 18, 2018, p. 63.
Ex. 1001 U.S. Pat. No. 9,298,057 B2, Dated Jul. 18, 2018, p. 34.
Ex. 1002 Prosecution History of U.S. Pat. No. 9,298,057 B2, Dated Jul. 18, 2018, p. 338.
Ex. 1003 Declaration of Richard A. Flasck re IPR of U.S. Pat. No. 9,298,057 B2, Dated Jul. 18, 2018, p. 69.
Ex. 1004 US Patent Application Publication No. 20110109351 A1 Yamazaki et al., Dated Jul. 18, 2018, p. 61.
Ex. 1005 U.S. Pat. No. 8169558 B2 Morimoto et al., Dated Jul. 18, 2018, p. 12.
Mandatory Notice, Dated Aug. 8, 2018, p. 4.
Power of Attorney, Dated Aug. 8, 2018, p. 1.
Notice of Filing Date Accorded to Petition and Time for Filing Patent Owner Preliminary Response, Dated Sep. 11, 2018, p. 6.
Response to Notice, Dated Sep. 13, 2018, p. 3.
Corrected Ex. 1003 Declaration of Richard A. Flasck re IPR of U.S. Pat. No. 9,289,057 B2, dated Sep. 13, 2018, p. 68.

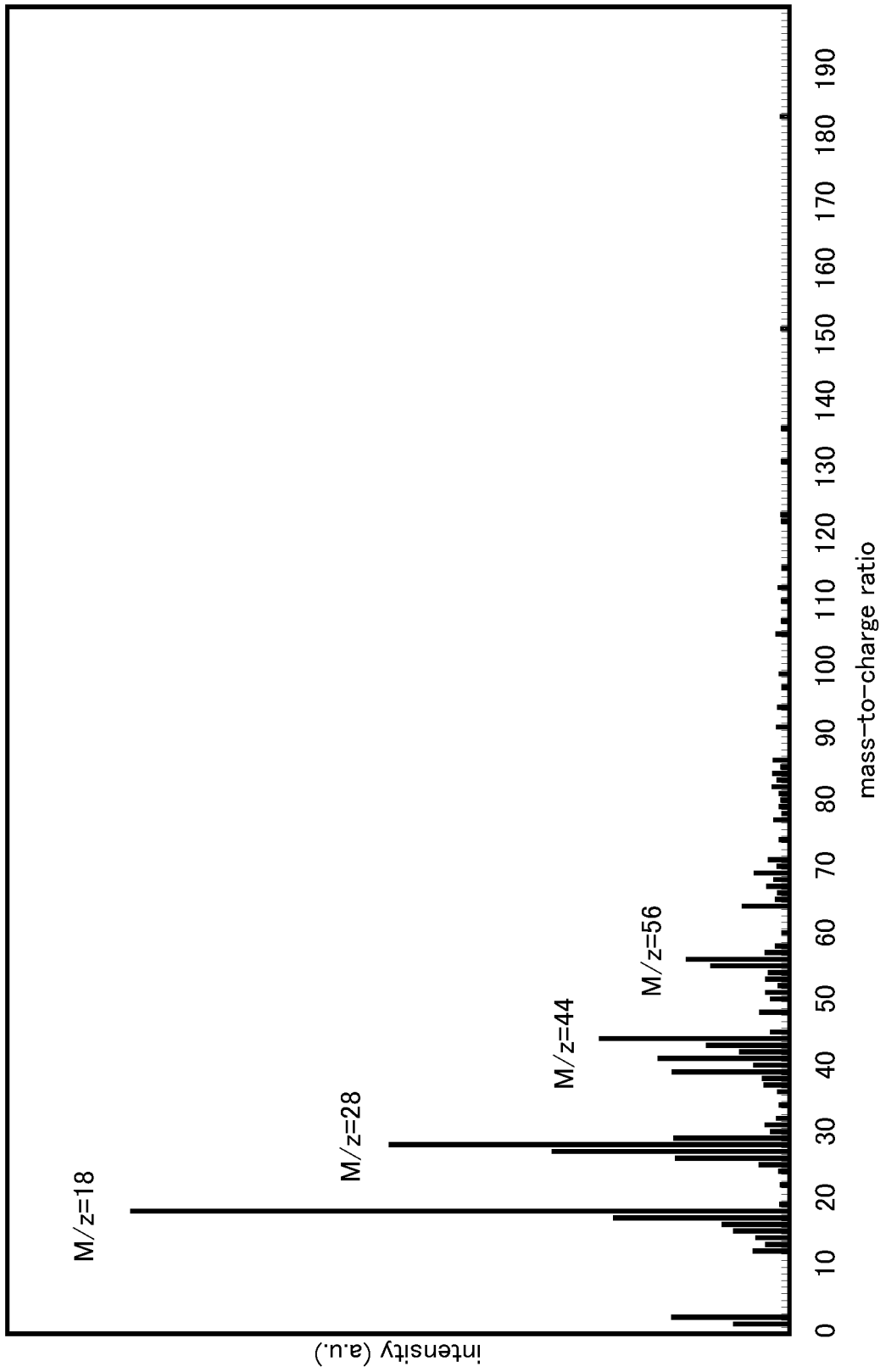

DISPLAY DEVICE AND ELECTRONIC DEVICE INCLUDING THE DISPLAY DEVICE

CROSS-REFERENCE TO RELATED APPLICATIONS

This application is a continuation of U.S. application Ser. No. 17/994,525, filed Nov. 28, 2022, now allowed, which is a continuation of U.S. application Ser. No. 17/562,070, filed Dec. 27, 2021, now U.S. Pat. No. 11,531,243, which is a continuation of U.S. application Ser. No. 16/720,439, filed Dec. 19, 2019, now U.S. Pat. No. 11,209,710, which is a continuation of U.S. application Ser. No. 16/175,021, filed Oct. 30, 2018, now U.S. Pat. No. 10,514,580, which is a continuation of U.S. application Ser. No. 15/012,092, filed Feb. 1, 2016, now U.S. Pat. No. 10,514,579, which is a continuation of U.S. application Ser. No. 13/939,323, filed Jul. 11, 2013, now U.S. Pat. No. 9,298,057, which claims the benefit of a foreign priority application filed in Japan as Serial No. 2012-161344 on Jul. 20, 2012, all of which are incorporated by reference.

TECHNICAL FIELD

The present invention relates to a display device using a liquid crystal panel or a display device using an organic EL panel. The present invention further relates to an electronic device including the display device.

BACKGROUND ART

In recent years, display devices using liquid crystal panels and display devices using organic EL panels have been under active development. These display devices are broadly classified into display devices in which only a transistor for pixel control (pixel transistor) is formed over a substrate and a scanning circuit (driver circuit) is included in a peripheral IC and display devices in which a scanning circuit is formed over the same substrate as the pixel transistor.

A display device in which a driver circuit is integrated with a pixel transistor is effective in reducing the frame width of the display device or cost of the peripheral IC. However, a transistor used in the driver circuit is required to have better electrical characteristics (e.g., field-effect mobility ($\mu$FE) or threshold) than the pixel transistor.

A silicon-based semiconductor material is widely known as a material for a semiconductor thin film applicable to a transistor. As another material, an oxide semiconductor material has been attracting attention. For example, a transistor in which a semiconductor thin film is formed using an amorphous oxide that contains indium (In), gallium (Ga), and zinc (Zn) and has an electron carrier concentration lower than $10^{18}/cm^3$ is disclosed (for example, see Patent Document 1).

A transistor using an oxide semiconductor for a semiconductor layer has higher field-effect mobility than a transistor using amorphous silicon which is a silicon-based semiconductor material for a semiconductor layer. Hence, the transistor using an oxide semiconductor can operate at high speed and be suitably used for the display device in which a pixel transistor is integrated with a driver circuit. Besides, manufacturing steps of the transistor using an oxide semiconductor are easier than those of a transistor using polycrystalline silicon for a semiconductor layer.

However, a problem of the transistor using an oxide semiconductor for a semiconductor layer is that entry of impurities such as hydrogen or moisture into the oxide semiconductor generates carriers and changes electrical characteristics of the transistor.

To solve the above problem, a transistor whose reliability is improved by making the concentration of hydrogen atoms in an oxide semiconductor film used as a channel formation region of the transistor less than $1 \times 10^{16}$ cm$^{-3}$ is disclosed (e.g., Patent Document 2).

REFERENCES

Patent Document 1: Japanese Published Patent Application No. 2006-165528
Patent Document 2: Japanese Published Patent Application No. 2011-139047

DISCLOSURE OF INVENTION

As also described in Patent Document 2, to sufficiently maintain the electrical characteristics of the transistor using an oxide semiconductor film for a semiconductor layer, it is important to remove hydrogen, moisture, and the like from the oxide semiconductor film as much as possible.

Further, when transistors are used for both a pixel region and a driver circuit region in a display device, an electrical load on the transistor used for the driver circuit region is larger than that on the transistor used for the pixel region, although this depends on the driving method. Thus, electrical characteristics of the transistor used for the driver circuit region is important.

In particular, a problem with display devices in which transistors using an oxide semiconductor film for a semiconductor layer are used for the pixel region and the driver circuit region has been deterioration of the transistor used for the driver circuit region, which occurs in a reliability test in a high temperature and high humidity environment. The cause of the deterioration of the transistor is an increase in the carrier density of the oxide semiconductor film used as the semiconductor layer due to entry of moisture or the like into the oxide semiconductor film from an organic insulating film formed over the transistor.

In view of the above, an object of one embodiment of the present invention is to suppress changes in the electrical characteristics of a display device including transistors in a pixel region and a driver circuit region and improve the reliability of the display device. An object of one embodiment of the present invention is, in particular, to suppress entry of hydrogen or moisture into the oxide semiconductor film in a display device using an oxide semiconductor film for a channel formation region of a transistor, suppress changes in the electrical characteristics of the display device, and improve its reliability.

To achieve any of the above objects, one embodiment of the present invention provides a structure which can suppress changes in the electrical characteristics of transistors used for a pixel region and a driver circuit region in a display device. Specifically, one embodiment of the present invention provides a structure in which, an oxide semiconductor film is used for a channel formation region of a transistor, and a planarization film formed with an organic insulating material over the transistor has a characteristic structure so that hydrogen or moisture hardly enters the oxide semiconductor film, particularly the oxide semiconductor film used for the driver circuit region. The structure is more specifically described below.

One embodiment of the present invention is a display device including a pixel region where a plurality of pixels each including a pixel electrode and at least one first transistor electrically connected to the pixel electrode is arranged, a first substrate provided with a driver circuit region that is located outside and adjacent to the pixel region and includes at least one second transistor which supplies a signal to the first transistor included in each of the pixels in the pixel region, a second substrate provided to face the first substrate, a liquid crystal layer interposed between the first substrate and the second substrate, a first interlayer insulating film including an inorganic insulating material over the first transistor and the second transistor, a second interlayer insulating film including an organic insulating material over the first interlayer insulating film, and a third interlayer insulating film including an inorganic insulating material over the second interlayer insulating film. In the display device, the third interlayer insulating film is provided in part of an upper region of the pixel region, and an edge portion of the third interlayer insulating film is formed on an inner side than the driver circuit region.

In the above structure, the following may be included: a first alignment film over the pixel electrode; the liquid crystal layer over the first alignment film; a second alignment film over the liquid crystal layer; a counter electrode over the second alignment film; an organic protective insulating film over the counter electrode; a colored film and a light-blocking film over the organic protective insulating film, and the second substrate over the colored film and the light-blocking film.

Another embodiment of the present invention is a display device including a pixel region where a plurality of pixels each including a pixel electrode and at least one first transistor electrically connected to the pixel electrode is arranged, a first substrate provided with a driver circuit region that is located outside and adjacent to the pixel region and includes at least one second transistor which supplies a signal to the first transistor included in each of the pixels in the pixel region, a second substrate provided to face the first substrate, a light-emitting layer interposed between the first substrate and the second substrate, a first interlayer insulating film including an inorganic insulating material over the first transistor and the second transistor, a second interlayer insulating film including an organic insulating material over the first interlayer insulating film, and a third interlayer insulating film including an inorganic insulating material over the second interlayer insulating film. In the display device, the third interlayer insulating film is provided in part of an upper region of the pixel region, and an edge portion of the third interlayer insulating film is formed on an inner side than the driver circuit region.

In the above structure, the light-emitting layer over the pixel electrode and an electrode over the light-emitting layer may be included.

Further, in any of the above structures, the third interlayer insulating film is preferably one selected from a silicon nitride film, a silicon nitride oxide film, and an aluminum oxide film.

Further, in any of the above structures, a semiconductor material included in a channel formation region of each of the first transistor and the second transistor is preferably an oxide semiconductor. In addition, the first transistor and the second transistor each preferably include a gate electrode, a semiconductor layer including an oxide semiconductor over the gate electrode, and a source electrode and a drain electrode over the semiconductor layer.

One embodiment of the present invention includes, in its category, an electronic device including a display device having any of the above structures.

Changes in the electrical characteristics of a display device including transistors in a pixel region and a driver circuit region can be suppressed, and the reliability of the display device can be improved. In particular, entry of hydrogen or moisture into the oxide semiconductor film in a display device using an oxide semiconductor film for a channel formation region of a transistor can be suppressed, changes in the electrical characteristics of the display device can be suppressed, and its reliability can be improved.

BRIEF DESCRIPTION OF DRAWINGS

In the accompanying drawings:

FIG. 8 shows the ion intensity of released gas versus mass-to-charge ratio;

BEST MODE FOR CARRYING OUT THE INVENTION

Figure 1A:
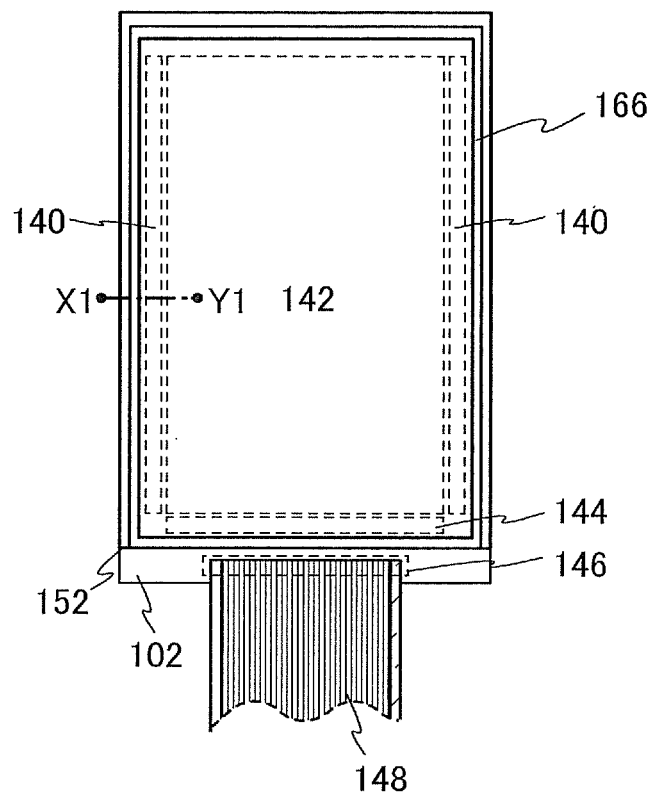
FIGS. 1A to 1C illustrate top views of one mode of a display device.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

In embodiments hereinafter described, the same components may be denoted by the same reference numerals throughout the drawings. Note that the thickness, the width, a relative position, and the like of components, namely, layers, regions, and the like illustrated in the drawings are exaggerated in some cases for clarification in the description of the embodiment.

In this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Further, in this specification or the like, a silicon nitride oxide film is a film containing nitrogen, oxygen, and silicon as its components and containing more nitrogen than oxygen. Further, a silicon oxynitride film is a film containing oxygen, nitrogen, and silicon as its components and containing more oxygen than nitrogen.

Functions of a "source" and a "drain" are sometimes replaced with each other when a transistor of opposite polarity is used or when the direction of current flowing is changed in circuit operation, for example. Therefore, the terms "source" and "drain" can be used to denote the drain and the source, respectively, in this specification and the like.

Embodiment 1

In this embodiment, a display device using a liquid crystal panel is described as one mode of a display device with reference to FIGS. 1A to 1C and FIG. 2.

Figure 1B:
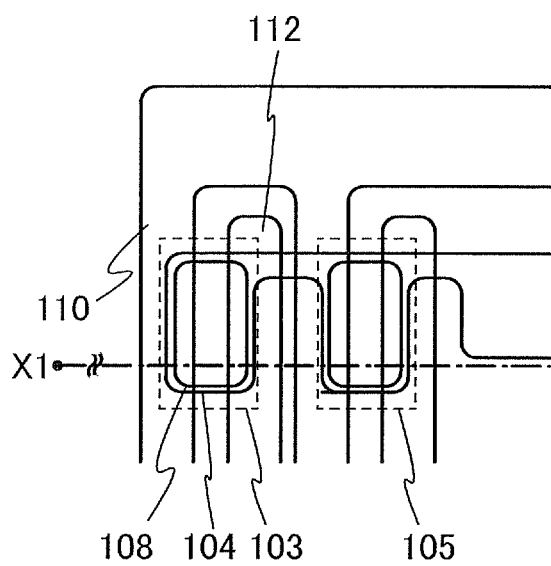
Figure 1C:
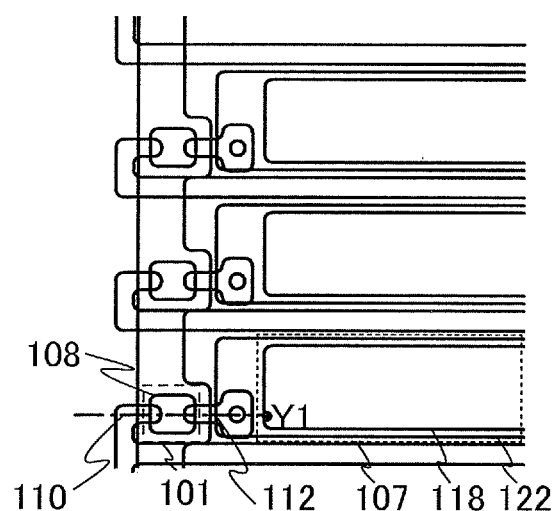

FIGS. 1A to 1C illustrate top views of the display device as one mode of a display device. Note that FIG. 1A, FIG. 1B, and FIG. 1C illustrate top views of the whole display device, part of a driver circuit portion of the display device, and part of a pixel region, respectively. In addition, FIG. 2 corresponds to a cross-sectional view taken along the line X1-Y1 in FIG. 1A.

In the display device illustrated in FIG. 1A, a sealant 166 is provided so as to surround a pixel region 142, and gate driver circuit portions 140 and a source driver circuit portion 144, which are driver circuit regions that are located outside and adjacent to the pixel region 142 and supply signals to the pixel region 142, which are provided over a first substrate 102; sealing is performed with a second substrate 152. The second substrate 152 is provided so as to face the first substrate 102 where the pixel region 142, the gate driver circuit portions 140, and the source driver circuit portion 144 are provided. Thus, the pixel region 142, the gate driver circuit portions 140, and the source driver circuit portion 144 are sealed together with a display element by the first substrate 102, the sealant 166, and the second substrate 152.

In FIG. 1A, a flexible printed circuit (FPC) terminal portion 146 which is electrically connected to the pixel region 142, the gate driver circuit portions 140, and the source driver circuit portion 144 is provided in a region that is different from the region surrounded by the sealant 166, over the first substrate 102. An FPC 148 is connected to the FPC terminal portion 146. Signals and potentials applied to the pixel region 142, the gate driver circuit portions 140, and the source driver circuit portion 144 are supplied through the FPC 148.

Although an example in which the gate driver circuit portions 140 and the source driver circuit portion 144 are formed over the first substrate 102 where the pixel region 142 is formed is shown in FIG. 1A, this structure does not limit the present invention. For example, only the gate driver circuit portions 140 may be formed over the first substrate 102 so that an additionally provided substrate where a source driver circuit is formed (e.g., a driver circuit substrate formed using a single crystal semiconductor film or a polycrystalline semiconductor film) is mounted on the first substrate 102.

Although a structure in which the two gate driver circuit portions 140 are placed on both sides of the pixel region 142 is exemplified in FIG. 1A, this structure does not limit the present invention. For example, a gate driver circuit portion 140 may be placed on only one side of the pixel region 142.

There is no particular limitation on a method of connecting the additionally provided driver circuit substrate; a chip on glass (COG) method, a wire bonding method, a tape automated bonding (TAB) method, or the like can be used.

In addition, the display device includes a panel in which a display element is sealed and a module in which an IC and the like including a controller are mounted on the panel.

As described above, some or all of the driver circuits which include transistors can be formed over the first substrate 102 where the pixel region 142 is formed, so that a system-on-panel can be obtained.

In FIG. 1C, a first transistor 101 and a capacitor 107 are formed in the pixel region 142. In the first transistor 101, a gate electrode 104, a source electrode 110, and a drain electrode 112 are electrically connected to a semiconductor layer 108. Although not illustrated in the plan view in FIG. 1C, over the first transistor 101, a first interlayer insulating film formed using an inorganic insulating material, a second interlayer insulating film formed using an organic insulating material over the first interlayer insulating film, and a third interlayer insulating film formed using an inorganic insulating material over the second interlayer insulating film are formed. The capacitor 107 includes a capacitor electrode 118, the third interlayer insulating film formed over the capacitor electrode 118, and a pixel electrode 122 formed over the third interlayer insulating film.

In FIG. 1B, a second transistor 103 and a third transistor 105 are formed in the gate driver circuit portion 140 which is a driver circuit region. In each of the transistors in the gate driver circuit portion 140, the gate electrode 104, the source electrode 110, and the drain electrode 112 are electrically connected to the semiconductor layer 108. In the gate driver circuit portion 140, a gate line including the gate electrode 104 extends in the horizontal direction, a source line including the source electrode 110 extends in the vertical direction, and a drain line including the drain electrode 112 extends in the vertical direction with a distance from the source electrode.

The gate driver circuit portion 140 including the second transistor 103 and the third transistor 105 can supply a signal to the first transistor 101 included in each pixel of the pixel region 142.

To control various signals, raise a voltage, and the like, the second transistor 103 and the third transistor 105 in the gate driver circuit portion 140 require a relatively high voltage, specifically a voltage of about 10 V to 30 V. In contrast, the first transistor 101 in the pixel region 142 is used only for switching of a pixel and therefore can be driven at a voltage of about several volts to 20 volts. Thus, a stress applied to the second transistor 103 and the third transistor 105 in the gate driver circuit portion 140 is much larger than a stress applied to the first transistor 101 in the pixel region 142.

To specifically describe a structure of the display device illustrated in FIGS. 1A to 1C, structures of the gate driver circuit portion 140 and the pixel region 142 are described below using FIG. 2 corresponding to a cross-sectional view along the line X1-Y1 in FIGS. 1A to 1C.

In the pixel region 142, the first transistor 101 is formed with the first substrate. 102, the gate electrode 104 formed over the first substrate 102, a gate insulating film 106 formed over the gate electrode 104, the semiconductor layer 108 which is in contact with the gate insulating film 106 and provided to overlap with the gate electrode 104, the source electrode 110 and the drain electrode 112 formed over the gate insulating film 106 and the semiconductor layer 108.

In addition, the pixel region 142 includes a first interlayer insulating film 114 formed using an inorganic insulating material over the first transistor 101, specifically over the gate insulating film 106, the semiconductor layer 108, the source electrode 110, and the drain electrode 112, a second interlayer insulating film 116 formed using an organic insulating material over the first interlayer insulating film 114, the capacitor electrode 118 formed over the second interlayer insulating film 116, a third interlayer insulating film 120 formed using an inorganic insulating material over the second interlayer insulating film 116 and the capacitor electrode 118, and the pixel electrode 122 formed over the third interlayer insulating film 120.

Note that the capacitor 107 is formed with the capacitor electrode 118, the third interlayer insulating film 120, and the pixel electrode 122. The capacitor electrode 118, the third interlayer insulating film 120, and the pixel electrode 122 are preferably formed using a material having the property of transmitting visible light, in which case large capacitance can be ensured without reducing the aperture ratio of the pixel region.

The pixel region 142 includes, over the pixel electrode 122, a first alignment film 124, a liquid crystal layer 162 provided over the first alignment film 124, a second alignment film 164 provided over the liquid crystal layer 162, a counter electrode 158 provided over the second alignment film 164, an organic protective insulating film 156 provided over the counter electrode 158, a colored film 153 and a light-blocking film 154 which are provided over the organic protective insulating film 156, and the second substrate 152 provided over the colored film 153 and the light-blocking film 154.

Note that a liquid crystal element 150 which is a display element is formed with the pixel electrode 122, the first alignment film 124, the liquid crystal layer 162, the second alignment film 164, and the counter electrode 158.

In the gate driver circuit portion 140, the second transistor 103 and the third transistor 105 are formed with the first substrate 102, the gate electrode 104 formed over the first substrate 102, the gate insulating film 106 formed over the gate electrode 104, the semiconductor layer 108 which is in contact with the gate insulating film 106 and provided to overlap with the gate electrode 104, the source electrode 110 and the drain electrode 112 formed over the gate insulating film 106 and the semiconductor layer 108.

In addition, the gate driver circuit portion 140 includes the first interlayer insulating film 114 formed over the second transistor 103 and the third transistor 105, specifically over the gate insulating film 106, the semiconductor layer 108, the source electrode 110, and the drain electrode 112, and the second interlayer insulating film 116 formed over the first interlayer insulating film 114.

Thus, the third interlayer insulating film 120 is provided in part of an upper region of the pixel region 142, and an edge portion of the third interlayer insulating film 120 is formed on an inner side than the gate driver circuit portion 140 which is a driver circuit region.

The above-described structure allows moisture taken in from the outside or a gas of moisture, hydrogen, or the like generated in the display device to be released to a portion above the second interlayer insulating film 116 of the gate driver circuit portion 140. Accordingly, it is possible to suppress incorporation of a gas of moisture, hydrogen, or the like into the first transistor 101, the second transistor 103, and the third transistor 105.

For the second interlayer insulating film 116 formed using an organic insulating material, an organic insulating material with which the planarity is improved is needed so that unevenness of the transistors included in the display device or the like is reduced. This is because the reduction in the unevenness of the transistors or the like leads to an improvement of the display quality of the display device. However, when heating or the like is performed, the organic insulating material releases hydrogen, moisture, or an organic component as a gas.

The above-mentioned gas of hydrogen, moisture, or an organic component is unlikely to be a great problem for a transistor using a silicon film, which is a silicon-based semiconductor material, in the semiconductor layer 108, for example. However, in one embodiment of the present invention, the semiconductor layer 108 is formed using an oxide semiconductor film, and hence the gas from the second interlayer insulating film 116 formed using an organic insulating material needs to be suitably released. Note that, when the semiconductor layer 108 is formed using an oxide semiconductor film, the structure in which an edge portion of the third interlayer insulating film 120 is formed on an inner side than the gate driver circuit portion 140 which is a driver circuit region has an excellent effect. Further, a similar effect can also be obtained in a transistor with the semiconductor layer 108 formed using a material (e.g., amorphous silicon or crystalline silicon which is a silicon-based semiconductor material) other than an oxide semiconductor.

In this embodiment, the third interlayer insulating film 120 formed using an inorganic insulating material over the second interlayer insulating film 116 formed using an organic insulating material is used as a dielectric of the capacitor 107. Further, the third interlayer insulating film 120 formed using an inorganic insulating material can suppress entry of hydrogen, moisture, or the like into the second interlayer insulating film 116 from the outside.

However, if the third interlayer insulating film 120 is formed over the second interlayer insulating film 116 over the second transistor 103 and the third transistor 105 which are used for the gate driver circuit portion 140, the gas released from the organic insulating material in the second interlayer insulating film 116 cannot be dispersed into the outside and enters the second transistor 103 and the third transistor 105.

When the above-described gas released from the organic insulating material enters the oxide semiconductor used in the semiconductor layer 108 of the transistors, the gas is taken in as an impurity into the oxide semiconductor film. This changes characteristics of the transistors using the semiconductor layer 108.

Figure 2:
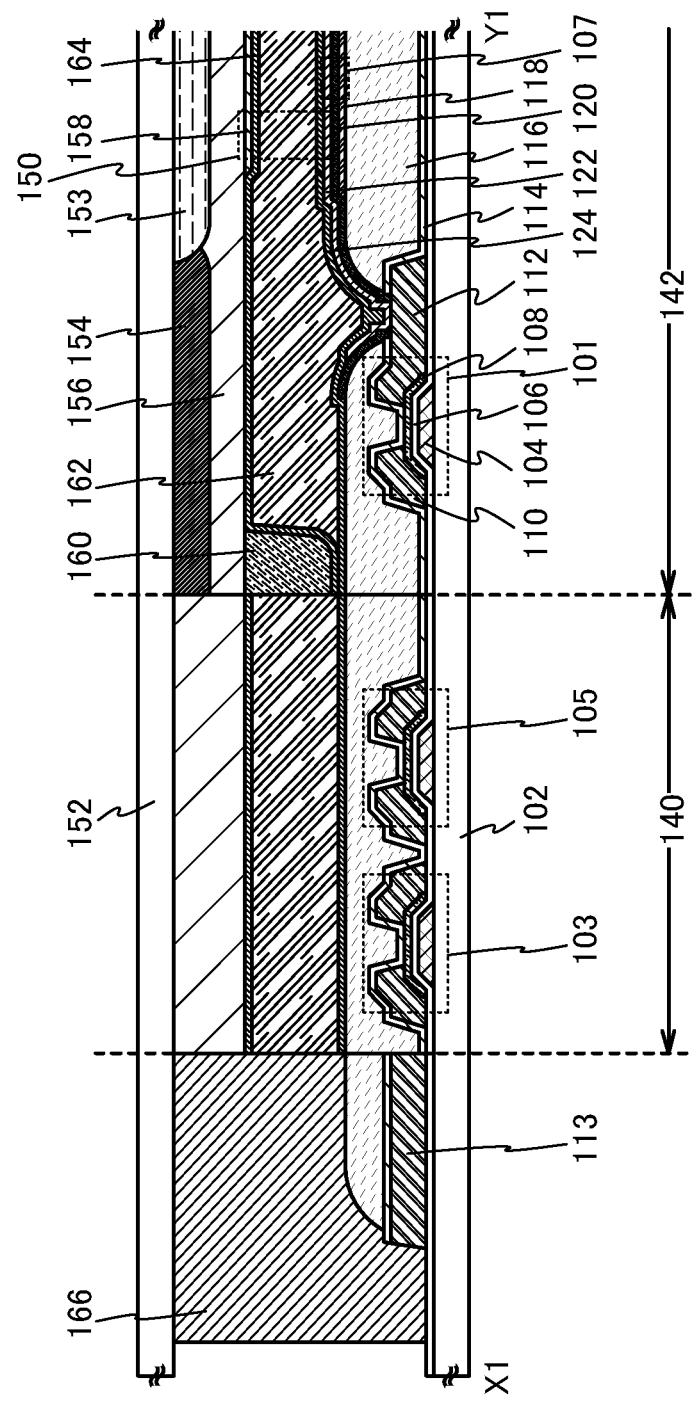
FIG. 2 illustrates a cross section of one mode of a display device.

In contrast, in the structure as illustrated in FIG. 2 where the third interlayer insulating film 120 is holed over the second transistor 103 and the third transistor 105 which are used for the gate driver circuit portion 140, that is, the third interlayer insulating film 120 is provided in part of the pixel region 142 and an edge portion of the third interlayer insulating film 120 is formed on an inner side than the gate driver circuit portion 140, the gas released from the second interlayer insulating film 116 can be dispersed into the outside.

Also in the first transistor 101 used for the pixel region 142, as illustrated in FIG. 2, it is preferable to remove a portion of the third interlayer insulating film 120 formed using an inorganic insulating material, which overlaps with the semiconductor layer 108. Such a structure can suppress entry of the gas released from the second interlayer insulating film 116 formed using an organic insulating material into the first transistor 101.

Here, other components of the display device illustrated in FIGS. 1A to 1C and FIG. 2 are detailed below.

For the first substrate 102 and the second substrate 152, a glass material such as aluminosilicate glass, aluminoborosilicate glass, or barium borosilicate glass is used. In the mass production, for the first substrate 102 and the second substrate 152, a mother glass with any of the following sizes is preferably used: the 8-th generation (2160 mm×2460 mm), the 9-th generation (2400 mm×2800 mm, or 2450 mm×3050 mm), the 10-th generation (2950 mm×3400 mm), and the like. High process temperature and a long period of process time drastically shrink the mother glass. Hence, in the case where mass production is performed with the use of the mother glass, it is preferable that the heat process in the manufacturing process be preferably performed at a temperature lower than or equal to 600° C., further preferably lower than or equal to 450° C., still further preferably lower than or equal to 350° C.

Note that a base insulating film may be provided between the first substrate 102 and the gate electrode 104. As the base insulating film, a silicon oxide film, a silicon oxynitride film, a silicon nitride film, a silicon nitride oxide film, a gallium oxide film, a hafnium oxide film, an yttrium oxide film, an aluminum oxide film, an aluminum oxynitride film, and the like can be given as examples. Note that when a silicon nitride film, a gallium oxide film, a hafnium oxide film, an yttrium oxide film, an aluminum oxide film, or the like is used as the base insulating film, it is possible to suppress entry of impurities such as an alkali metal, water, and hydrogen from the first substrate 102 into the oxide semiconductor layer 108.

For the gate electrode 104, a metal element selected from aluminum, chromium, copper, tantalum, titanium, molybdenum, and tungsten, an alloy containing any of these metal elements as a component, an alloy containing these metal elements in combination, or the like can be used. One or both of the metal elements of manganese and zirconium may be used. Further, the gate electrode 104 may have a single-layer structure or a stacked-layer structure of two or more layers. A single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given as examples. Alternatively, a film, an alloy film, or a nitride film which contains aluminum and one or more elements selected from titanium, tantalum, tungsten, molybdenum, chromium, neodymium, and scandium may be used.

The gate electrode 104 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to use a stacked-layer structure formed using the above light-transmitting conductive material and the above metal element.

Further, between the gate electrode 104 and the gate insulating film 106, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of a metal nitride (such as InN or ZnN), or the like may be provided. These films each have a work function higher than or equal to 5 eV, preferably higher than or equal to 5.5 eV, which is higher than the electron affinity of the oxide semiconductor. Hence, the threshold voltage of the transistor using the oxide semiconductor can be shifted in the positive direction, and a so-called normally-off switching element can be achieved. For example, as an In—Ga—Zn-based oxynitride semiconductor film, an In—Ga—Zn-based oxynitride semiconductor film having a higher nitrogen concentration than at least the semiconductor layer 108, specifically an In—Ga—Zn-based oxynitride semiconductor film having a nitrogen concentration higher than or equal to 7 at %, is used.

As the gate insulating film 106, a single layer or a stacked layer of, for example, a silicon oxide film, a silicon oxynitride film, a silicon nitride oxide film, a silicon nitride film, an aluminum oxide film, a hafnium oxide film, a gallium oxide film, a Ga—Zn-based metal oxide film, or the like can be provided. To improve the properties of the interface with the semiconductor layer 108, at least a region of the gate insulating film 106, which is in contact with the semiconductor layer 108, is preferably formed with an oxide insulating film.

Further, by providing an insulating film having a blocking effect against oxygen, hydrogen, water, and the like over the gate insulating him 106, it is possible to prevent outward diffusion of oxygen from the semiconductor layer 108 and entry of hydrogen, water, or the like into the semiconductor layer 108 from the outside. For the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples.

The gate insulating film 106 can be formed as a gate insulating film which has few defects and releases less hydrogen and less ammonia, when formed to have a stacked structure in which a silicon nitride film having few defects is used as a first silicon nitride film, a silicon nitride film which releases less hydrogen and less ammonia is provided as a second silicon nitride film over the first silicon nitride film, and an oxide insulating film is provided over the second silicon nitride film. Thus, transfer of hydrogen and nitrogen, which are contained in the gate insulating film 106, to the semiconductor layer 108 can be suppressed.

The use of a silicon nitride film as the gate insulating film 106 has the following effect. As compared with a silicon oxide film, a silicon nitride film has a high dielectric constant and needs a large thickness to obtain an equivalent capacitance. Thus, the physical thickness of the gate insulating film can be increased. Accordingly, a reduction in the withstand voltages of the first transistor 101, the second transistor 103, and the third transistor 105 is suppressed and the withstand voltages are improved, so that an electrostatic breakdown of the transistors used for the display device can be suppressed.

Further, in the case where copper is used for the gate electrode 104 and a silicon nitride film is used as the gate insulating film 106 in contact with the gate electrode 104, the number of the ammonia molecules released from the silicon nitride film by beating is preferably reduced as much as possible so that reaction between copper and the ammonia molecules can be suppressed.

In the transistor using an oxide semiconductor film for the semiconductor layer 108, the trap level (also referred to as interface level) at the interface between the oxide semiconductor film and the gate insulating film or in the gale insulating film shifts the threshold voltage of the transistor typically in the negative direction, and increases the sub-threshold swing (S value), which refers to a gate voltage needed for changing the drain current by an order of magnitude when the transistor is turned on. This results in the problem of variation in the electrical characteristics among transistors. Therefore, with the use of a silicon nitride film having few defects as the gate insulating film, the shift of the threshold voltage in the negative direction and the variation in the electrical characteristics among transistors can be reduced.

The gate insulating film 106 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage of the transistor can be reduced.

The thickness of the gate insulating film 106 is preferably greater than or equal to 5 nm and less than or equal to 400 nm, more preferably greater than or equal to 10 nm and less than or equal to 300 nm, still more preferably greater than or equal to 50 nm and less than or equal to 250 nm.

An oxide semiconductor is used for the semiconductor layer 108, which preferably contains at least indium (In) or zinc (Zn) or both In and Zn. In order to reduce variation in the electrical characteristics among the transistors using the oxide semiconductor, the oxide semiconductor preferably contains one or more of stabilizers in addition to In or Zn.

Examples of the stabilizer are gallium (Ga), tin (Sn), hafnium (Hf), aluminum (Al), zirconium (Zr), and the like. Another examples of the stabilizer are lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor, for example, any of the following can be used: indium oxide, tin oxide, zinc oxide, an In—Zn-based metal oxide, a Sn—Zn-based metal oxide, au Al—Zn-based metal oxide, a Zn—Mg-based metal oxide, a Sn—Mg-based metal oxide, an In—Mg-based metal oxide, an In—Ga-based metal oxide, an In—W-based metal oxide, an In—Ga—Zn-based metal oxide (also referred to as IGZO), an In—Al—Zn-based metal oxide, an In—Sn—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, an In—Lu—Zn-based metal oxide, an In—Sn—Ga—Zn-based metal oxide, an In—Hf—Ga—Zn-based metal oxide, an In—Al—Ga—Zn-based metal oxide, an In—Sn—Al—Zn-based metal oxide, an In—Sn—Hf—Zn-based metal oxide, and an In—Hf—Al—Zn-based metal oxide.

Note that, for example, an in-Ga—Zn-based metal oxide means an oxide containing In, Ga, and Zn as its main components and there is no particular limitation on the ratio of In to Ga and Zn. The In—Ga—Zn-based metal oxide may contain a metal element other than In, Ga, and Zn.

Alternatively, a material represented by $InMO_3(ZnO)_m$ (m is larger than 0 and not an integer) may be used as the oxide semiconductor. Note that M represents one or more metal elements selected from Ga, Fe, Mn, and Co. Alternatively, as the oxide semiconductor, a material represented by $In_2SnO_5(ZnO)_n$ (n is an integer greater than 0) may be used.

For example, it is possible to use an in-Ga—Zn-based metal oxide containing in, Ga, and Zn at an atomic ratio of 1:1:1 (=⅓:⅓:⅓), 2:2:1 (=⅖:⅖:⅕), or 3:1:2 (=½:⅙:⅓), or any of oxides whose composition is in the neighborhood of the above compositions. Alternatively, an In—Sn—Zn-based metal oxide containing In, Sn, and Zn at an atomic ratio of 1:1:1 (=⅓:⅓:⅓), 2:1:3 (=⅓:⅙:½), or 2:1:5 (=¼:⅛:⅝) may be used. Note that the proportion of each atom in the atomic ratio of the oxide semiconductor film may vary within a range of ±20% as an error.

However, the composition is not limited to those described above, and a material having the appropriate composition may be used depending on required semiconductor characteristics and electrical characteristics (e.g., field-effect mobility, threshold voltage, and variation). In order to obtain required semiconductor characteristics, it is preferable that the carrier density, the impurity concentration, the defect density, the atomic ratio of a metal element to oxygen, the interatomic distance, the density, and the like be set appropriate.

For example, high mobility can be obtained relatively easily in the case where an In—Sn—Zn-based metal oxide is used. Also in the case where an In—Ga—Zn-based metal oxide is used, the field-effect mobility can be increased by reducing the defect density in a bulk.

Further, the energy gap of a metal oxide that can be used for the semiconductor layer 108 is greater than or equal to 2 eV, preferably greater than or equal to 2.5 eV, more preferably greater than or equal to 3 eV. With the oxide semiconductor film having such a wide energy gap, the off-state current of the transistor can be reduced.

Next, a structure of the oxide semiconductor film that can be used as the semiconductor layer 108 is described below.

An oxide semiconductor film is roughly classified into a non-single-crystal oxide semiconductor film and a single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

Here, the CAAC-OS film is described.

The CAAC-OS film is one of oxide semiconductor films including a plurality of crystal parts, and most of each crystal part fits inside a cube whose one side is less than 100 nm. Thus, there is a case where a crystal part included in the CAAC-OS film fits a cube whose one side is less than 10 nm, less than 5 nm, or less than 3 nm.

In a transmission electron microscope (TEM) image of the CAAC-OS film, a boundary between crystal parts, that is, a grain boundary is not clearly confirmed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 560. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depends on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° is derived from the (311) plane of a $ZnGa_2O_4$ crystal; such a peak indicates that a $ZnGa_2O_4$ crystal is included in part of the CAAC-OS film including the $InGaZnO_4$ crystal. It is preferable that in the CAAC-OS film, a peak of 2θ appear at around 31° and a peak of 2θ do not appear at around 36°.

The CAAC-OS film is an oxide semiconductor film having a low impurity concentration. The impurity is any of elements which are not the main components of the oxide semiconductor film and includes hydrogen, carbon, silicon, a transition metal element, and the like. In particular, an element (e.g., silicon) which has higher bonding strength with oxygen than a metal element included in the oxide semiconductor film causes disorder of atomic arrangement in the oxide semiconductor film because the element deprives the oxide semiconductor film of oxygen, thereby reducing crystallinity. Further, a heavy metal such as iron or nickel, argon, carbon dioxide, aid the like have a large atomic radius (or molecular radius); therefore, when any of such elements is contained in the oxide semiconductor film, the element causes disorder of the atomic arrangement of the oxide semiconductor film, thereby reducing crystallinity. Note that the impurity contained in the oxide semiconductor film might become a carrier trap or a source of carriers.

The CAAC-OS film is an oxide semiconductor film having a low density of defect states. For example, oxygen vacancies in the oxide semiconductor film serve as carrier traps or serve as carrier generation sources when hydrogen is captured therein.

The state in which impurity concentration is low and density of defect states is low (few oxygen vacancies) is referred to as "highly purified intrinsic" or "substantially highly purified intrinsic". A highly purified intrinsic or substantially highly purified intrinsic oxide semiconductor film has few carrier generation sources, and thus has a low carrier density. Thus, a transistor using the oxide semiconductor film rarely has a negative threshold voltage (rarely has normally-on characteristics). A highly purified intrinsic or substantially highly purified intrinsic oxide semiconductor film has few carrier traps. Accordingly, the transistor using the oxide semiconductor film little changes in electrical characteristics and high reliability. Note that charges trapped by the carrier traps in the oxide semiconductor film takes a long time to be released and may behave like fixed charges. Thus, the transistor using the oxide semiconductor film with a high impurity concentration and a high density of defect states has unstable electrical characteristics in some cases.

In a transistor using the CAAC-OS film, change in electrical characteristics due to irradiation with visible light or ultraviolet light is small.

For example, the CAAC-OS film is formed with a polycrystalline oxide semiconductor sputtering target by a sputtering method. When ions collide with the sputtering target, a crystal region included in the sputtering target may be separated from the target along an a-b plane, and a sputtered particle having a plane parallel to the a-b plane (a flat-plate-like sputtered particle or a pellet like sputtered particle) may be separated from the target. In that case, the flat-plate-like sputtered particle reaches a substrate while keeping its crystal state, so that the CAAC-OS film can be formed over the substrate.

For the formation of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle occurs after the sputtered particle reaches the substrate. Specifically, the substrate heating temperature during the deposition is 100° C. to 740° C., preferably 150° C. to 500° C. By increasing the substrate heating temperature during the deposition, when the flat-plate-like sputtered particle reaches the substrate, migration occurs on the substrate, so that a flat plane of the sputtered particle is attached to the substrate.

Furthermore, it is preferable to reduce plasma damage during the deposition by increasing the proportion of oxygen in the deposition gas and optimizing power. The proportion of oxygen in the deposition gas is 30 vol % or higher, preferably 100 vol %.

Alternatively, the oxide semiconductor film used as the semiconductor layer 108 may have a stacked-layer structure of a plurality of oxide semiconductor films. For example, the oxide semiconductor film may have a stacked-layer structure of a first oxide semiconductor film and a second oxide semiconductor film which are formed using metal oxides with different compositions. For example, the first oxide semiconductor film may be formed using any of a two-component metal oxide, a three-component metal oxide, and a four-component metal oxide, while the second oxide semiconductor film is formed using any of these which is different from the oxide for the first oxide semiconductor film.

Further, the constituent elements of the first oxide semiconductor film and the second oxide semiconductor film may be made the same while the composition of the constituent elements of the first oxide semiconductor film and the second oxide semiconductor film is made different. For example, the first oxide semiconductor film may contain In, Ga, and Zn at an atomic ratio of 1:1:1, while the second oxide semiconductor film contains In, Ga, and Zn at an atomic ratio of 3:1:2. Alternatively, the first oxide semiconductor film may contain In, Ga, and Zn at an atomic ratio of 1:3:2, while the second oxide semiconductor film contains In, Ga, and Zn at an atomic ratio of 2:1:3. Note that the proportion of each atom in the atomic ratio of the oxide semiconductor film varies within a range of ±20% as an error.

At this time, one of the first oxide semiconductor film and the second oxide semiconductor film, which is closer to the gate electrode (on the channel side), preferably contains In and Ga such that In>Ga. The other oxide semiconductor film, which is farther from the gate electrode (on the back channel side), preferably contains In and Ga such that In≤Ga.

Further, the oxide semiconductor film may have a three-layer structure of a first oxide semiconductor film, a second oxide semiconductor film, and a third oxide semiconductor film, in which the constituent elements thereof may be made the same, while the composition of the constituent elements of the first oxide semiconductor film, the second oxide semiconductor film, and the third oxide semiconductor film is made different. For example, the first oxide semiconductor film may contain In, Ga, and Zn at an atomic ratio of 1:3:2, the second oxide semiconductor film may contain In, Ga, and Zn at an atomic ratio of 3:1:2, and the third oxide semiconductor film may contain In, Ga, and Zn at an atomic ratio of 1:1:1.

In an oxide semiconductor film which contains less In than Ga and Zn at an atomic ratio, typically, the first oxide semiconductor film containing in, Ga, and Zn at an atomic ratio of 1:3:2, generation of oxygen vacancies can be more inhibited than in an oxide semiconductor film containing more In than Ga and Zn at an atomic ratio, typically, the second oxide semiconductor film, and an oxide semiconductor film containing Ga, Zn, and In at the same atomic ratio, typically, the third oxide semiconductor film, and accordingly, an increase in carrier density can be suppressed. Further, when the first oxide semiconductor film containing In, Ga, and Zn at an atomic ratio of 1:3:2 has an amorphous structure, the second oxide semiconductor film is likely to be a CAAC-OS film.

Since the constituent elements of the first oxide semiconductor film, the second oxide semiconductor film, and the third oxide semiconductor film are the same, the first oxide semiconductor film has fewer trap levels at the interface with the second oxide semiconductor film. Therefore, when the oxide semiconductor film has the above structure, the amount of change in the threshold voltage of the transistor due to a change over time or photodegradation can be reduced.

In an oxide semiconductor, the s orbital of heavy metal mainly contributes to carrier transfer, and when the In content in the oxide semiconductor is increased, overlap of the s orbitals is likely to be increased. Therefore, an oxide containing In and Ga such that In>Ga has higher carrier mobility than an oxide containing In and Ga such that In≤Ga. Further, in Ga, the formation energy of an oxygen vacancy is larger and thus an oxygen vacancy is less likely to occur, than in In; therefore, the oxide containing In and Ga such that In≤Ga has more stable characteristics than the oxide containing In and Ga such that In>Ga.

By the use of an oxide semiconductor containing In and Ga such that In>Ga for the oxide semiconductor film on the channel side and an oxide semiconductor containing In and Ga such that In≤Ga for the oxide semiconductor film on the bark channel side, the field-effect mobility and reliability of the transistor can be further improved.

Further, the first oxide semiconductor film, the second oxide semiconductor film, and the third oxide semiconductor film may be formed using oxide semiconductors having different crystallinity. In other words, the oxide semiconductor films may be formed using appropriate combination of a single crystal oxide semiconductor, a polycrystalline oxide semiconductor, a microcrystalline oxide semiconductor, an amorphous oxide semiconductor, and a CAAC-OS. When an amorphous oxide semiconductor is applied to the first oxide semiconductor film or the second oxide semiconductor film, internal stress of the oxide semiconductor film or external stress is reduced, change in characteristics of the transistor is reduced, and reliability of the transistor can be further improved.

The thickness of the oxide semiconductor film is preferably greater than or equal to 1 nm and less than or equal to 100 nm, more preferably greater than or equal to 1 nm and less than or equal to 30 nm, still more preferably greater than or equal to 1 nm and less than or equal to 50 nm, further preferably greater than or equal to 3 nm and less than or equal to 20 nm.

The concentration of an alkali metal or an alkaline earth metal in the oxide semiconductor film used for the semiconductor layer 108, which is obtained by secondary ion mass spectrometry (SIMS), is preferably less than or equal to $1\times10^{18}$ atoms/cm$^3$, more preferably less than or equal to $2\times10^{16}$ atoms/cm$^3$. This is because, when alkali metals or alkaline earth metals are bonded to an oxide semiconductor, some of the alkali metals or the alkaline earth metals generate carriers to increase the off-state current of the transistor.

Further, the hydrogen concentration in the oxide semiconductor film used for the semiconductor layer 108, which is obtained by secondary ion mass spectrometry, is lower than $5\times10^{18}$ atoms/cm$^3$, preferably less than or equal to $1\times10^{18}$ atoms/cm$^3$, more preferably less than or equal to $5\times10^{17}$ atoms/cm$^3$, still more preferably less than or equal to $1\times10^{16}$ atoms/cm$^3$.

Hydrogen contained in the oxide semiconductor film reacts with oxygen bonded to a metal atom to produce water, and a defect is formed in a lattice from which oxygen is released (or a portion from which oxygen is removed). In addition, when part of hydrogen is bonded to oxygen, electrons serving as carriers are generated. Thus, by reducing impurities including hydrogen as much as possible in the step of forming the oxide semiconductor film, the hydrogen concentration in the oxide semiconductor film can be reduced. Hence, by using an oxide semiconductor film in which hydrogen is removed as much as possible in the channel region, a shift of the threshold voltage in the negative direction can be suppressed and variation in electrical characteristics can be reduced. Further, leakage current between a source and a drain of the transistor, typically off-state current, can be reduced.

Furthermore, the nitrogen concentration in the oxide semiconductor film used for the semiconductor layer 108 is set to be less than or equal to $5\times10^{18}$ atoms/cm$^3$, which can suppress a shift of the threshold voltage in the negative direction and reduce variation in electrical characteristics.

Note that various experiments can prove the low off-state current of a transistor using an oxide semiconductor film which is highly purified by removing hydrogen as much as possible for a channel region. For example, even a transistor with a channel width of $1\times10^6$ μm and a channel length of 10 μm can have an off-state current less than or equal to the measurement limit of a semiconductor parameter analyzer, that is, less than or equal to $1\times10^{-13}$ A when the voltage (drain voltage) between a source electrode and a drain electrode ranges between 1 V and 10 V. In this case, it can be seen that the off-state current corresponding to a value obtained by dividing the off-state current by the channel width of the transistor is 100 zA/mm or less. In addition, a capacitor and a transistor were connected to each other and the off-state current was measured with a circuit in which charge flowing into or from the capacitor was controlled by the transistor. In the measurements, a highly purified oxide semiconductor film was used for a channel region of the transistor, and the off-state current of the transistor was measured from a change in the amount of charge of the capacitor per unit time. As a result, it was found that in the case where the voltage between the source electrode and the drain electrode of the transistor was 3 V, a lower off-state current of several tens of yoctoamperes per micrometer (yA/μm) was able to be obtained. Thus, the transistor whose channel region is formed using a highly purified oxide semiconductor film has a very low off-state current.

The source electrode 110 and the drain electrode 112 are formed to have a single-layer structure or a stacked-layer structure including, as a conductive material, any of metals such as aluminum, titanium, chromium, nickel, copper, yttrium, zirconium, molybdenum, silver, tantalum, and tungsten or an alloy containing any of these metals as its main component. The following structures can be given as examples: a single-layer structure of an aluminum film containing silicon; a two-layer structure in which a titanium film is stacked over an aluminum film; a two-layer structure in which a titanium film is stacked over a tungsten film; a two-layer structure in which a copper film is formed over a copper-magnesium-aluminum alloy film; a three-layer structure in which a titanium film or a titanium nitride film, an aluminum film or a copper film, and a titanium film or a titanium nitride film are stacked in this order; and a three-layer structure in which a molybdenum film or a molybdenum nitride film, an aluminum film or a copper film, and a molybdenum film or a molybdenum nitride film are stacked in this order; and the like. Note that a transparent conductive material containing indium oxide, tin oxide, or zinc oxide may be used.

The source electrode 110 and the drain electrode 112 are provided over the semiconductor layer 108 in this embodiment but may be provided between the gate insulating film 106 and the semiconductor layer 108.

As the first interlayer insulating film 114, au oxide insulating film is preferably used so as to improve characteristics of the interface with the oxide semiconductor film used for the semiconductor layer 108. As the first interlayer insulating film 114, a silicon oxide film, a silicon oxynitride film, an aluminum oxide film, a hafnium oxide film, a gallium oxide film, a Ga—Zn-based metal oxide film, or the like having a thickness greater than or equal to 150 nm and less than or equal to 400 nm can be used. The first interlayer insulating film 114 may have a stacked-layer structure of an oxide insulating film and a nitride insulating film. For example, the first interlayer insulating film 114 can have a stacked-layer structure of a silicon oxynitride film and a silicon nitride film.

For the second interlayer insulating film 116, an organic insulating material having heat resistance such as an acrylic-based resin, a polyimide-based resin, a benzocyclobutene-based resin, a polyamide-based resin, or an epoxy-based resin can be used. Note that the second interlayer insulating film 116 may be formed by stacking a plurality of insulating films formed using any of these materials. With the use of the second interlayer insulating film 116, the unevenness of the first transistor 101 and the like can be reduced.

The capacitor electrode 118 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as TO), indium zinc oxide, or indium tin oxide to which silicon oxide is added.

As the third interlayer insulating film 120, an inorganic insulating material such as a silicon oxide film, a silicon oxynitride film, a silicon nitride oxide film, a silicon nitride film, or an aluminum oxide film can be used. In particular, one selected from a silicon nitride film, a silicon nitride oxide film, and an aluminum oxide film is preferably used as the third interlayer insulating film 120. By use of one selected from a silicon nitride film, a silicon nitride oxide film, and an aluminum oxide film as the third interlayer insulating film 120, release of hydrogen or moisture from the second interlayer insulating film 116 can be suppressed.

As the pixel electrode 122, a material similar to that of the capacitor electrode 118 can be used. Although materials of the capacitor electrode 118 and the pixel electrode 122 may be the same or different, the use of the same materials is preferred, in which case manufacturing cost can be reduced.

For the first alignment film 124 and the second alignment film 164, an organic material having heat resistance such as an acrylic-based resin, a polyimide-based resin, a benzocyclobutene-based resin, a polyamide-based resin, or an epoxy-based resin can be used.

For the liquid crystal layer 162, a liquid crystal material such as thermotropic liquid crystal, low-molecular liquid crystal, high-molecular liquid crystal, polymer dispersed liquid crystal, ferroelectric liquid crystal, or anti-ferroelectric liquid crystal can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, liquid crystal exhibiting a blue phase for which an alignment film (the first alignment film 124 or the second alignment film 164) is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time, and has optical isotropy, which makes the alignment process unneeded and the viewing angle dependence small. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, the liquid crystal display device can be manufactured with improved productivity. A transistor using an oxide semiconductor film has a possibility that the electrical characteristics of the transistor may be significantly changed by the influence of static electricity and deviate from the designed range. Therefore, it is more effective to use a liquid crystal material exhibiting a blue phase for a liquid crystal display device including a transistor using an oxide semiconductor film.

The specific resistivity of the liquid crystal material is higher than or equal to $1 \times 10^9$ Ω·cm, preferably higher than or equal to $1 \times 10^{11}$ Ω·cm, further preferably higher than or equal to $1 \times 10^{12}$ Ω·cm. Note that the specific resistivity in this specification is measured at a temperature of 20° C.

The size of a storage capacitor formed in the display device is set considering the leakage current of the transistor provided in the pixel region or the like so that charge can be held for a predetermined period. The size of the storage capacitor can be set considering the off-state current of the transistor or the like. In the case where a transistor including an oxide semiconductor layer which is highly purified and in which formation of an oxygen vacancy is inhibited is used and, for example, a liquid crystal element is used as the display element, a storage capacitor having a capacitance that is ⅓ or less, preferably ⅕ or less of the liquid crystal capacitance of each pixel is sufficient.

It is possible to reduce the current in an off state (off-state current) of the transistor in this embodiment using the oxide semiconductor which is highly purified and in which formation of an oxygen vacancy is inhibited for the semiconductor layer. Accordingly, an electric signal such as an image signal can be held for a longer period, and a writing interval can be set longer in an on state. Thus, the frequency of refresh operation can be reduced, which leads to the effect of suppressing power consumption.

As a driving mode of the liquid crystal element 150 in the display device illustrated in FIGS. 1A to 1C and FIG. 2, a twisted nematic (TN) mode, an in-plane-switching (IPS) mode, a fringe field switching (FFS) mode, an Axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used. In particular, an FFS mode is preferably used to achieve a wide viewing angle.

The display device may be a normally black liquid crystal display device such as a transmissive liquid crystal display device utilizing a vertical alignment (VA) mode. Some examples are given as the vertical alignment mode. For example, a multi-domain vertical alignment (MVA) mode, a patterned vertical alignment (PVA) mode, and the like can be used. Moreover, it is possible to use a method called domain multiplication or multi-domain design, in which a pixel is divided into some regions (subpixels) and molecules are aligned in different directions in their respective regions.

Although not illustrated in FIGS. 1A to 1C and FIG. 2, an optical member (optical substrate) such as a polarizing member, a retardation member, or an anti-reflection member, and the like may be provided as appropriate. For example, circular polarization may be obtained by using a polarizing substrate and a retardation substrate. In addition, a backlight, a side light, or the like may be used as a light source.

As a method for display in the pixel region 142, a progressive method, an interlace method, or the like can be employed. Further, color components controlled in a pixel at the time of color display are not limited to three colors: R, G, and B (R, G, and B correspond to red, green, and blue, respectively). For example, R, G, B, and W (W corresponds to white) or R, G, B, and one or more of yellow, cyan, magenta, and the like can be used. Note that the sizes of display regions may be different between respective dots of color components. Note that the disclosed invention is not limited to the application to a display device for color display; the disclosed invention can also be applied to a display device for monochrome display.

Further, a spacer 160 is provided below the second substrate 152 so as to control the distance (cell gap) between the first substrate 102 and the second substrate 152. Note that the cell gap determines the thickness of the liquid crystal layer 162. The spacer 160 may have any shape, like a columnar spacer or a spherical spacer obtained by selective etching of an insulating film, or the like.

The colored film 153 functions as a so-called color filter. For the colored film 153, a material having the property of transmitting light in a specific wavelength band is used, and an organic resin film including a dye or a pigment, or the like can be used.

The light-blocking film 154 functions as a so-called black matrix. As the light-blocking film 154, as long as it can block light emitted from adjacent pixels, any film such as a metal film or an organic resin film including a black dye or a black pigment can be used. In this embodiment, the light-blocking film 154 formed of an organic resin film including a black pigment is exemplified.

The organic protective insulating film 156 is provided so that an ionic substance included in the colored film 153 is not dispersed into the liquid crystal layer 162. However, the organic protective insulating film 156 is not limited to this structure and not necessarily provided.

As the sealant 166, a thermosetting resin, an ultraviolet curable resin, or the like can be used. A region sealed by the sealant 166 illustrated in FIG. 2 has a structure in which the gate insulating film 106, an electrode 113 formed in the same step as the source electrode 110 and the drain electrode 112, the first interlayer insulating film 114, and the second interlayer insulating film 116 are provided between the first substrate 102 and the second substrate 152; however, this structure is an example and does not limit the present invention. For example, the structure may be a structure in which only the gate insulating film 106 and the first interlayer insulating film 114 are provided. Entry of moisture or the like from the outside is more prevented when the second interlayer insulating film 116 is removed, and therefore, part of the second interlayer insulating film 116 is preferably removed or recessed as illustrated in FIG. 2.

As described above, the display device described in this embodiment includes the transistors formed in the pixel region and the driver circuit region, the first interlayer insulating film formed over the transistors, the second interlayer insulating film formed over the first interlayer insulating film, and the third interlayer insulating film formed over the second interlayer insulating film. In this structure, the third interlayer insulating film is provided in part of an upper region of the pixel region, and an edge portion of the third interlayer insulating film is formed on an inner side than the driver circuit region. This structure can suppress entry of the gas released from the second interlayer insulating film into the transistor side, which can increase the reliability of the display device. Further, the first interlayer insulating film can suppress entry of the gas released from the second interlayer insulating film into the transistor side.

This embodiment can be implemented in appropriate combination with any of the structures described in the other embodiments and examples.

Embodiment 2

Figure 3:
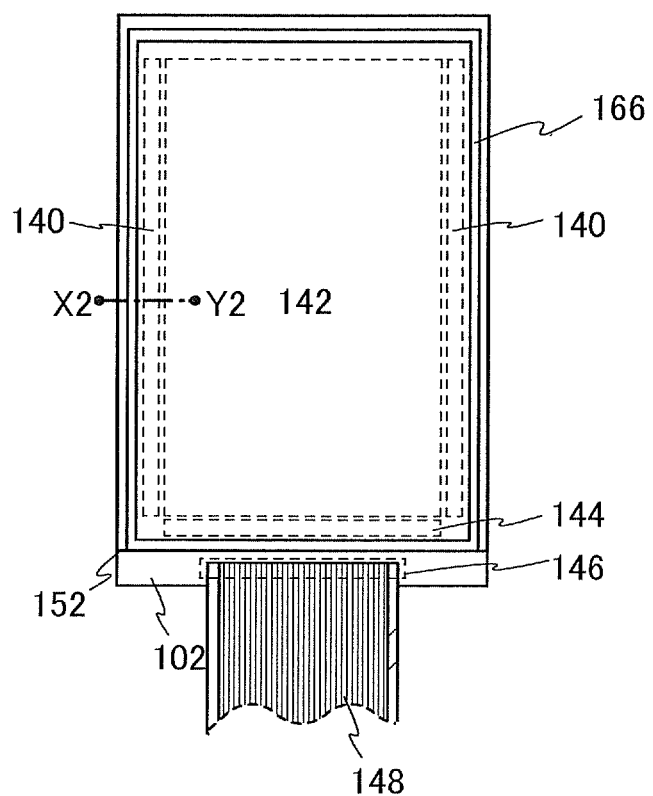
FIG. 3 illustrates a top view of one mode of a display device.
Figure 4:
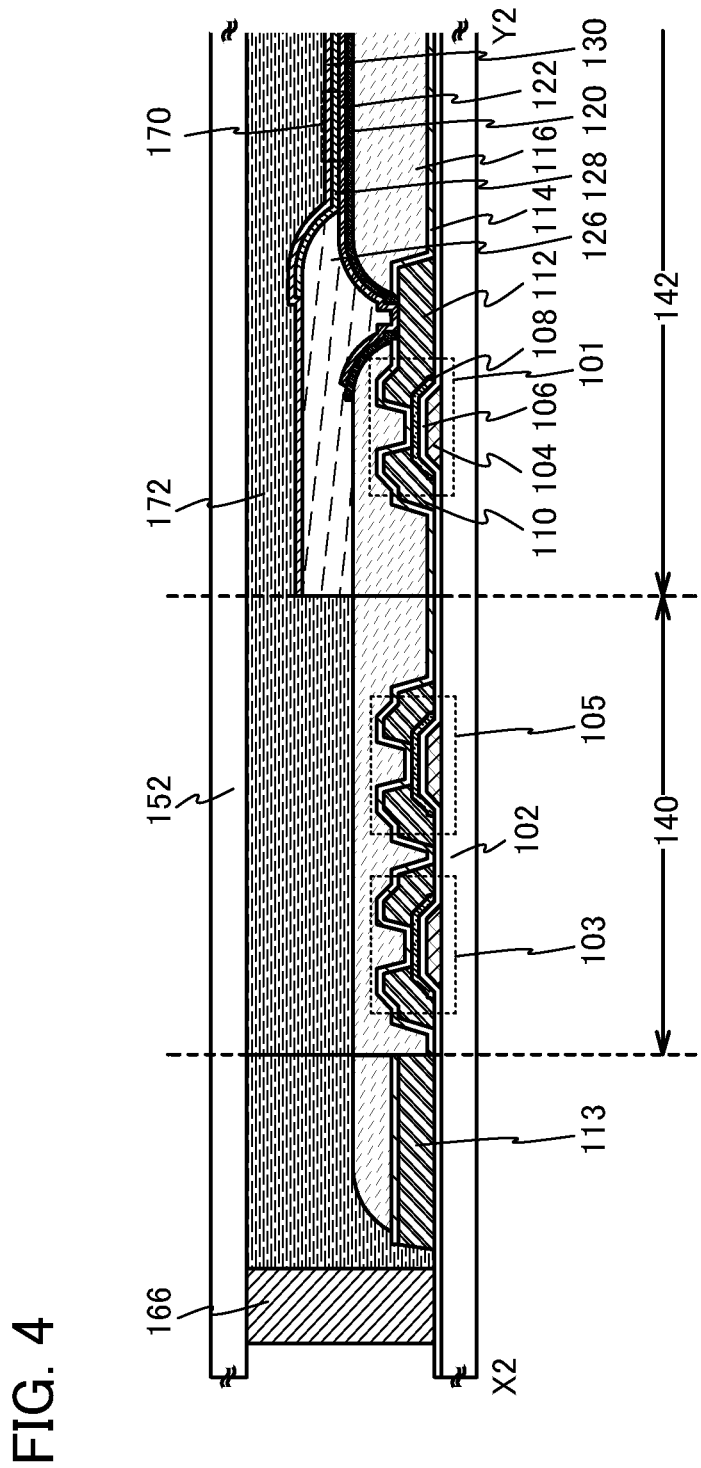
FIG. 4 illustrates a cross section of one mode of a display device.

In this embodiment, a display device using an organic EL panel is described as one mode of a display device with reference to FIG. 3 and FIG. 4. Note that portions that are similar to the portions in Embodiment 1 are denoted by the same reference numerals, and detailed description thereof is omitted.

FIG. 3 and FIG. 4 illustrate a top view and a cross-sectional view, respectively, of the display device as one mode of a display device. Note that FIG. 4 corresponds to a cross-sectional view along the line X2-Y2 in FIG. 3.

In the display device illustrated in FIG. 3, a sealant 166 is provided so as to surround a pixel region 142, and gate driver circuit portions 140 and a source driver circuit portion 144, which are driver circuit regions that are located outside and adjacent to the pixel region 142 and supply signals to the pixel region 142, which are provided over a first substrate 102; sealing is performed with a second substrate 152. The second substrate 152 is provided so as to face the first substrate 102 where the pixel region 112, the gate driver circuit portions 140, and the source driver circuit portion 144 are provided. Thus, the pixel region 142, the gate driver circuit portions 140, and the source driver circuit portion 144 are sealed together with a display element by the first substrate 102, the sealant 166, and the second substrate 152.

As described above, some or all of the driver circuits which include transistors can be formed over the first substrate 102 where the pixel region 142 is formed, so that a system-on-panel can be obtained. Further, the whole or part of a driver circuit including a thin film transistor can be formed over the same substrate as a pixel region, so that a system-on-panel can be obtained.

Next, structures of the pixel region 142 and the gate driver circuit portion 140 are detailed below using FIG. 4 corresponding to a cross-sectional view along the line X2-Y2 in FIG. 3.

In the pixel region 142, the first transistor 101 is formed with the first substrate 102, the gate electrode 104 formed over the first substrate 102, a gate insulating film 106 formed over the gate electrode 104, the semiconductor layer 108 which is in contact with the gate insulating film 106 and provided to overlap with the gate electrode 104, the source electrode 110 and the drain electrode 112 formed over the gate insulating film 106 and the semiconductor layer 108.

In addition, the pixel region 142 includes the following: the first interlayer insulating film 114 formed using an inorganic insulating material over the first transistor 101, specifically over the gate insulating film 106, the semiconductor layer 108, the source electrode 110, and the drain electrode 112; the second interlayer insulating film 116 formed using an organic insulating material over the first interlayer insulating film 114; the third interlayer insulating film 120 formed using an inorganic insulating material over the second interlayer insulating film 116; a partition 126 formed over the second interlayer insulating film 116 and the third interlayer insulating film 120; the pixel electrode 122 formed over the third interlayer insulating film 120 and the partition 126; a light-emitting layer 128 formed over the pixel electrode 122; and an electrode 130 formed over the light-emitting layer 128.

Note that the pixel electrode 122, the light-emitting layer 128, and the electrode 130 form a light-emitting element 170.

In addition, a filler 172 is provided over the light-emitting element 170, specifically over the electrode 130. Over the filler 172, the second substrate 152 is provided. In other words, the light-emitting element 170 and the filler 172 are interposed between the first substrate 102 and the second substrate 152.

In the gate driver circuit portion 140, the second transistor 103 and the third transistor 105 are formed with the first substrate 102, the gate electrode 104 formed over the first substrate 102, the gate insulating film 106 formed over the gate electrode 104, the semiconductor layer 108 which is in contact with the gate insulating film 106 and provided to overlap with the gate electrode 104, the source electrode 110 and the drain electrode 112 formed over the gate insulating film 106 and the semiconductor layer 108.

In addition, the gate driver circuit portion 140 includes the first interlayer insulating film 114 formed using an inorganic insulating material over the second transistor 103 and the third transistor 105, specifically over the gate insulating film 106, the semiconductor layer 108, the source electrode 110, and the drain electrode 112, and the second interlayer insulating film 116 formed using an organic insulating material over the first interlayer insulating film 114.

Thus, the third interlayer insulating film 120 is provided in part of an upper region of the pixel region 142, and an edge portion of the third interlayer insulating film 120 is formed on an inner side than the gate driver circuit portion 140 which is a driver circuit region.

The above-described structure allows moisture taken in from the outside or a gas of moisture, hydrogen, or the like generated in the display device to be released to a portion above the second interlayer insulating film 116 of the gate driver circuit portion 140. Accordingly, it is possible to suppress incorporation of a gas of moisture, hydrogen, or the like into the first transistor 101, the second transistor 103, and the third transistor 105.

For the second interlayer insulating film 116 formed using an organic insulating material, an organic insulating material with which the planarity is improved is needed so that unevenness of the transistors included in the display device or the like is reduced. This is because the reduction in the unevenness of the transistors or the like leads to an improvement of the display quality of the display device. However, when heating or the like is performed, the organic insulating material releases hydrogen, moisture, or an organic component as a gas.

The above-mentioned gas of hydrogen, moisture, or an organic component is unlikely to be a great problem for a transistor using a silicon film, which is a silicon-based semiconductor material, in the semiconductor layer 108, for example. However, in one embodiment of the present invention, the semiconductor layer 108 is formed using an oxide semiconductor film, and hence the gas from the second interlayer insulating film 116 formed using an organic insulating material needs to be suitably released. Note that, when the semiconductor layer 108 is formed using an oxide semiconductor film, the structure in which an edge portion of the third interlayer insulating film 120 is formed on an inner side than the gate driver circuit portion 140 which is a driver circuit region has an excellent effect. Further, a similar effect can also be obtained in a transistor with the semiconductor layer 108 formed using a material (e.g., amorphous silicon or crystalline silicon which is a silicon-based semiconductor material) other than an oxide semiconductor.

In this embodiment, the third interlayer insulating film 120 over the second interlayer insulating film 116 is formed in order to suppress entry of the gas released from the second interlayer insulating film 116 into the light-emitting element 170 side and/or to improve adhesion between the pixel electrode 122 and the second interlayer insulating film 116. Such a structure can suppress entry of the gas of hydrogen, moisture, or the like from the second interlayer insulating film 116 into the light-emitting element 170 side.

However, if the third interlayer insulating film 120 is formed over the second interlayer insulating film 116 over the second transistor 103 and the third transistor 105 which are used for the gate driver circuit portion 140, the gas released from the organic insulating material in the second interlayer insulating film 116 cannot be dispersed into the outside and enters the second transistor 103 and the third transistor 105.

When the above-described gas enters the oxide semiconductor used in the semiconductor layer 108 of the transistors, the gas is taken in as an impurity into the oxide semiconductor film. This changes characteristics of the transistors using the semiconductor layer 108.

In contrast, in the structure as illustrated in FIG. 4 where the third interlayer insulating film 120 is holed over the second transistor 103 and the third transistor 105 which are used for the gate driver circuit portion 140, that is, the third interlayer insulating film 120 is provided in part of the pixel region 142 and an edge portion of the third interlayer insulating film 120 is formed on an inner side than the gate driver circuit portion 140, the gas released from the second interlayer insulating film 116 can be dispersed into the outside.

Also in the first transistor 101 used for the pixel region 142, as illustrated in FIG. 4, it is preferable to remove a portion of the third interlayer insulating film 120 formed using an inorganic insulating material, which overlaps with the semiconductor layer 108. Such a structure can suppress entry of the gas released from the second interlayer insulating film 116 formed using an organic insulating material into the first transistor 101.

Here, other components of the display device illustrated in FIG. 3 and FIG. 4 which differ in structure from those in the display device described in Embodiment 1 are detailed below.

The partition 126 is formed using an organic insulating material or an inorganic insulating material. It is particularly preferable that the partition 126 be formed using a photosensitive resin material to have an opening over the pixel electrode 122 so that a sidewall of the opening is formed as a tilted surface with continuous curvature.

As the filler 172, an ultraviolet curable resin or a thermosetting resin can be used as well as an inert gas such as nitrogen or argon. For example, polyvinyl chloride (PVC), an acrylic-based resin, a polyimide-based resin, an epoxy-based resin, a silicone-based resin, polyvinyl butyral (PVB), or ethylene vinyl acetate (EVA) can be used. For example, nitrogen is used as the filler 172.

As the light-emitting element 170, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element. Here, an organic EL element is used.

In an organic EL element, by application of a voltage to a light-emitting element, electrons and holes are separately injected from a pair of electrodes (the pixel electrode 122 and the electrode 130) into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

To extract light from the light-emitting element 170, at least one of the electrodes (the pixel electrode 122 or the electrode 130) has a light-transmitting property. The light-emitting element can employ any of the following emission structures: a top emission structure in which light emission is extracted through the surface opposite to the first substrate 102; a bottom emission structure in which light emission is extracted through the surface on the first substrate 102 side; or a dual emission structure in which light emission is extracted through the surface opposite to the first substrate 102 and the surface on the first substrate 102 side.

A protective film may be formed over the electrode 130 and the partition 126 in order to prevent oxygen, hydrogen, moisture, carbon dioxide, or the like from entering the light-emitting element 170. As the protective film, a silicon nitride film, a silicon nitride oxide film, or the like can be formed. In addition, in a space which is formed with the first substrate 102, the second substrate 152, and the sealant 166, the filler 172 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element 170. Further, the polarizing plate or the circularly polarizing plate may be provided with an anti-reflection film. For example, anti-glare treatment by which reflected light can be diffused by projections and depressions on the surface so as to reduce the glare can be performed.

For the light-emitting layer 128, it is preferable to use organic compounds including a guest material which is a light-emitting material converting triplet excitation energy to light emission and a host material the triplet excitation energy level (Ti level) of which is higher than that of the guest material. Note that the light-emitting layer 128 may have a structure in which a plurality of light-emitting layers is stacked (so-called tandem structure) or a structure including a functional layer (e.g., a hole-injection layer, a hole-transport layer, an electron-transport layer, an electron-injection layer, or a charge generation layer) other than a light-emitting layer.

For the sealant 166, a material containing a glass material, such as a glass body formed by melting and solidifying powder glass (also called frit glass), may be used in addition to any of the materials described in Embodiment 1. Such a material can effectively suppress permeation of moisture and gas. Hence, when the light-emitting element 170 is used as the display element, deterioration of the light-emitting element 170 can be suppressed, so that the display device can have very high reliability.

A region sealed by the sealant 166 illustrated in FIG. 4 has a structure in which only the gate insulating film 106 is provided between the first substrate 102 and the second substrate 152; however, this structure is an example and does not limit the present invention. For example, the structure may be a structure in which the gate insulating film 106 and the first interlayer insulating film 114 are stacked. Note that in a preferred structure, the sealant 166 is placed in a region where the second interlayer insulating film 16 is removed, as illustrated in FIG. 4.

As described above, the display device described in this embodiment includes the transistors formed in the pixel region and the driver circuit region, the first interlayer insulating film formed over the transistors, the second interlayer insulating film formed over the first interlayer insulating film, and the third interlayer insulating film formed over the second interlayer insulating film. In this structure, the third interlayer insulating film is provided in part of an upper region of the pixel region, and an edge portion of the third interlayer insulating film is formed on an inner side than the driver circuit region. This structure can suppress entry of the gas released from the second interlayer insulating film into the transistor side, which can increase the reliability of the display device. Further, the first interlayer insulating film can suppress entry of the gas released from the second interlayer insulating film into the transistor side.

This embodiment can be implemented in appropriate combination with any of the structures described in the other embodiments and examples.

Embodiment 3

In this embodiment, an image sensor that can be used in combination with any of the display devices described in the above embodiments is described.

Figures 5A, 5B:
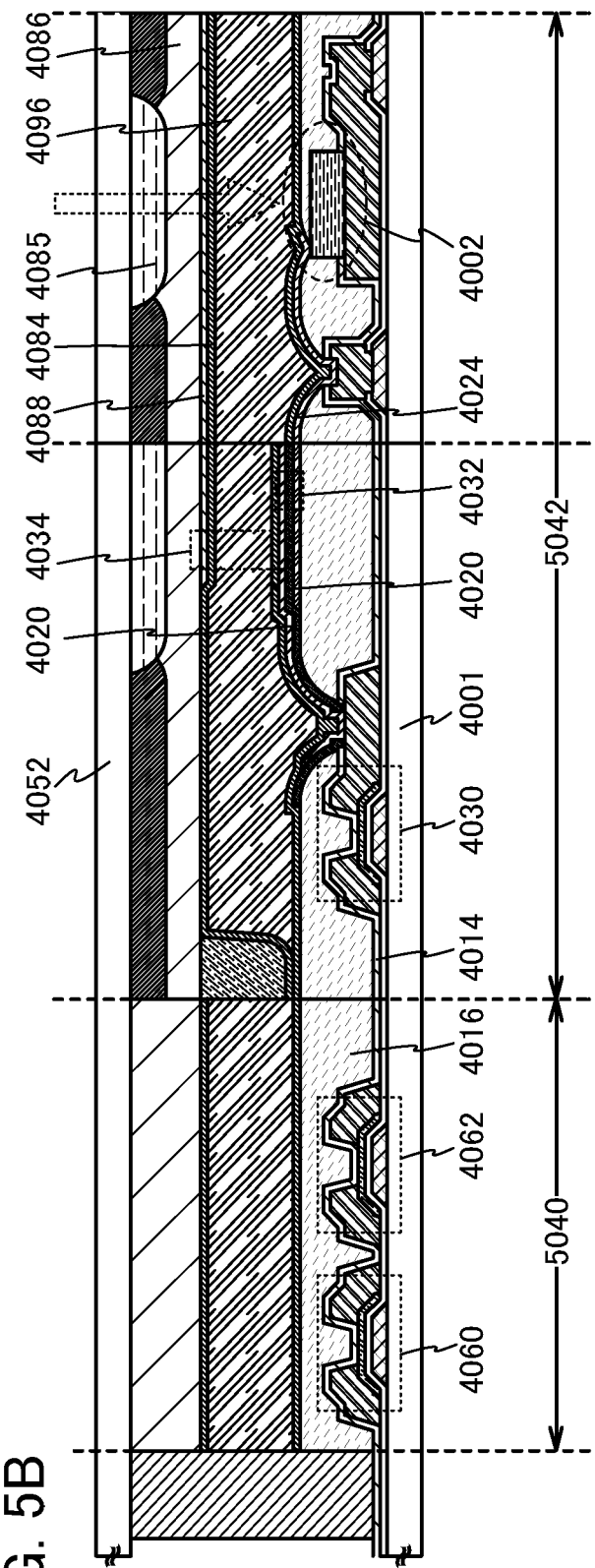
FIGS. 5A and 5B illustrate a circuit diagram and a cross-sectional view of an example of a display device with an image sensor according to one embodiment of the present invention.

An example of a display device with an image sensor is illustrated in FIG. 5A. FIG. 5A illustrates an equivalent circuit of a pixel of the display device with an image sensor.

One electrode of a photodiode element 4002 is electrically connected to a reset signal line 4058, and the other electrode of the photodiode element 4002 is electrically connected to a gate electrode of a transistor 4040. One of a source electrode and a drain electrode of the transistor 4040 is electrically connected to a power supply potential (VDD), and the other of the source electrode and the drain electrode of the transistor 4040 is electrically connected to one of a source electrode and a drain electrode of a transistor 4056. A gate electrode of the transistor 4056 is electrically connected to a gate selection line 4057, and the other of the source electrode and the drain electrode of the transistor 4056 is electrically connected to an output signal line 4071.

A first transistor 4030 is a transistor for pixel switching. One of a source electrode and a drain electrode of the first transistor 1030 is electrically connected to a video signal line 4059, and the other of the source electrode and the drain electrode of the first transistor 4030 is electrically connected to a capacitor 4032 and a liquid crystal element 4034. A gate electrode of the first transistor 4030 is electrically connected to a gate line 4036.

Note that structures of the first transistor 4030, the capacitor 4032, and the liquid crystal element 4034 can be similar to those in the display device described in Embodiment 1.

FIG. 5B illustrates a cross section of part of a pixel of the display device with an image sensor and a cross section of a driver circuit portion. In a pixel region 5042, the photodiode element 4002 and the first transistor 4030 are provided over a first substrate 4001. In a gate driver circuit portion 5040 which is a driver circuit, a second transistor 4060 and a third transistor 4062 are provided over the first substrate 4001.

Over the photodiode element 4002 and the first transistor 4030 in the pixel region 5042, a first interlayer insulating film 4014, a second interlayer insulating film 4016, and a third interlayer insulating film 4020 are formed. Over the second interlayer insulating film 4016, the capacitor 4032 using the third interlayer insulating film 4020 as a dielectric is formed.

Thus, the third interlayer insulating film 4020 is provided in part of the pixel region 5042, and an edge portion of the third interlayer insulating film 4020 is formed on an inner side than the gate driver circuit portion 5040. By this structure, a gas released from the second interlayer insulating film 4016 can be dispersed into the outside. Thus, this structure can suppress entry of the gas released from the second interlayer insulating film 4016 into the transistor side, which can increase the reliability of the display device.

In the photodiode element 4002, a lower electrode formed in the same step as the source electrode and the drain electrode of the first transistor 4030 and an upper electrode formed in the same step as a pixel electrode of the liquid crystal element 4034 are included as a pair of electrodes, and a diode is present between the pair of electrodes.

As a diode that can be used as the photodiode element 4002, a pn-type diode including a stack of a p-type semiconductor film and an n-type semiconductor film, a pin-type diode including a stack of a p-type semiconductor film, an i-type semiconductor film, and an n-type semiconductor film, a Schottky diode, or the like can be used.

Over the photodiode element 4002, a first alignment film 4024, a liquid crystal layer 4096, a second alignment film 4084, a counter electrode 4088, an organic insulating film 1086, a colored film 4085, a second substrate 4052, and the like are provided.

Note that a pin-type diode has better photoelectric conversion characteristics when the p-type semiconductor film side is used as a light-receiving plane. This is because the hole mobility is lower than the electron mobility. This embodiment shows an example in which light which enters the photodiode element 1002 from a surface of the second substrate 4052 through the colored film 4085, the liquid crystal layer 4096, and the like is converted into an electric signal, but this example does not limit the present invention. For example, the colored film 4085 may be omitted.

The photodiode element 4002 described in this embodiment utilizes flow of current between the pair of electrodes which is caused by entry of light into the photodiode element 4002. When the photodiode element 4002 detects light, information of an object to be detected can be read.

By performing, for example, a step of forming the transistor for the display device and a step for the image sensor at the same time, the productivity of the display device with the image sensor described in this embodiment can be increased. However, any of the display devices described in the above embodiments and the image sensor described in this embodiment may be fabricated over different substrates. Specifically, the image sensor may be fabricated over the second substrate in any of the display devices described in the above embodiments.

This embodiment can be implemented in appropriate combination with any of the structures described in the other embodiments and examples.

Embodiment 4

In this embodiment, an example of a tablet terminal using a display device of one embodiment of the present invention is described.

Figure 6A:
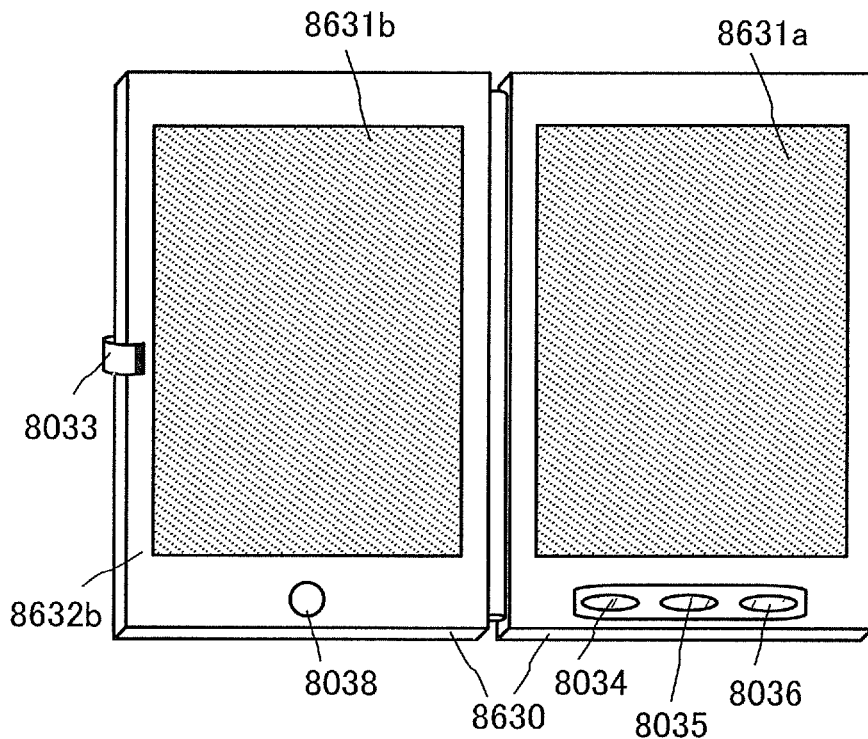
FIGS. 6A to 6C illustrate an example of a tablet terminal according to one embodiment of the present invention.
Figure 6B:
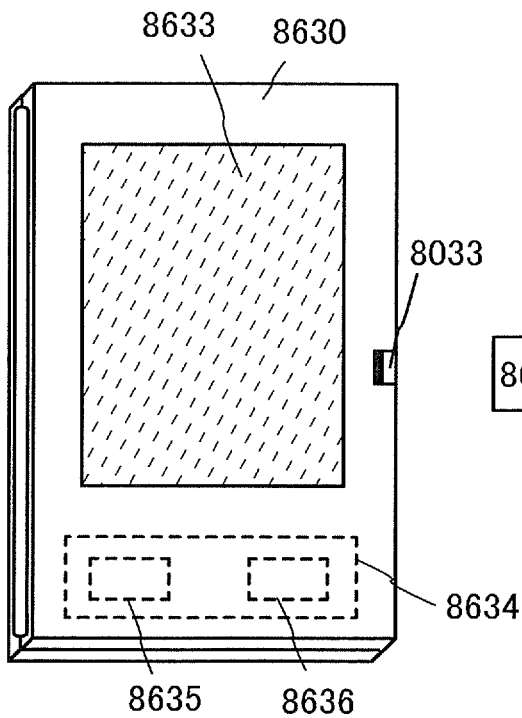
Figure 6C:
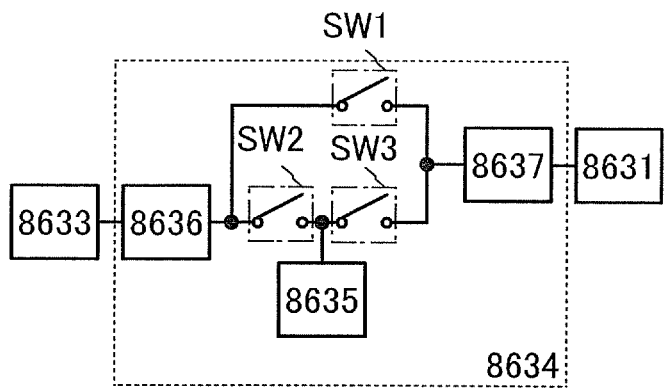

FIGS. 6A to 6C illustrate a foldable tablet terminal. FIG. 6A illustrates the tablet terminal which is unfolded. The tablet terminal includes a housing 8630, and a display portion 8631*a*, a display portion 8631*b*, a display mode switch 8034, a power switch 8035, a power-saving mode switch 8036, a clasp 8033, and an operation switch 8038 which are provided on the housing 8630.

A display device of one embodiment of the present invention can be applied to the display portion 8631*a* and the display portion 8631*b*.

The whole or part of the display portion 8631*a* can function as a touch panel and data can be input when a displayed operation key is touched. For example, the display portion 8631*a* can display keyboard buttons in the whole region to function as a touch panel, and the display portion 8631*b* may be used as a display screen.

Like the display portion 8631*a*, the whole or part of the display portion 8631*b* can function as a touch panel.

Further, a touch panel region of the display portion 8631*a* and a touch panel region of the display portion 8631*b* can be touched for input at the same time.

With the display mode switch 8034, the display can be switched between a portrait mode, a landscape mode, and the like, and between monochrome display and color display, for example. With the power-saving mode switch 8036, display luminance can be controlled in accordance with external light detected by an optical sensor incorporated in the tablet terminal. Note that in addition to the optical sensor, another detection device including a sensor such as a gyroscope or an acceleration sensor which is capable of detecting inclination may be included in the tablet terminal.

Note that FIG. 6A shows an example in which the areas of the display portion 8631*a* and the display portion 8631*b* are the same; however, this example does not limit the present invention. The display portion 8631*a* and the display portion 8631*b* may differ in area or display quality. For example, one display panel may be capable of higher-definition display than the other display panel.

The tablet terminal is closed in FIG. 6B. The tablet terminal includes the housing 8630, and a solar cell 8633 and a charge and discharge control circuit 8634 with which the housing 8630 is provided. In FIG. 6B, a structure including a battery 8635 and a DCDC converter 8636 is illustrated as an example of the charge and discharge control circuit 8634.

Since the tablet terminal is foldable, the housing 8630 can be closed when the tablet terminal is not used. Thus, the display portion 8631*a* and the display portion 8631*b* can be protected, which leads to excellent durability and excellent reliability in terms of long-term use.

The tablet terminal illustrated in FIGS. 6A to 6C can also have a function of displaying various kinds of data (e.g., a still image, a moving image, and a text image), a function of displaying a calendar, the date, the time, or the like on the display portion, a touch-input function of operating or editing data displayed on the display portion by touch input, a function of controlling processing by various kinds of software (programs), and the like.

Electric power obtained with the solar cell 8633 can be used for the operation of the tablet terminal or can be stored in the battery 8635. Note that the solar cell 8633 can be provided on both surfaces of the housing 8630. When a lithium ion battery is used as the battery 8635, there is an advantage of downsizing or the like.

The structure and the operation of the charge and discharge control circuit 8634 illustrated in FIG. 6B are described with reference to a block diagram in FIG. 6C. In FIG. 6C, the solar cell 8633, the battery 8635, the DCDC converter 8636, a converter 8637, a switch SW1, a switch SW2, a switch SW3, and a display portion 8631 are illustrated. The battery 8635, the DCDC converter 8636, the converter 8637, and the switches SW1 to SW3 in FIG. 6C correspond to the charge and discharge control circuit 8634 illustrated in FIG. 6B.

In the case where power is generated by the solar cell 8633, the voltage of the power generated by the solar cell is raised or lowered by the DCDC converter 8636 so that the power has a voltage for charging the battery 8635. Then, the switch SW1 is turned on and the voltage of the power is stepped up or down by the converter 8637 so as to be the most suitable voltage for the display portion 8631. In addition, when display on the display portion 8631 is not performed, the switch SW1 is turned off and the switch SW2 is turned on so that the battery 8635 is charged.

Note that the solar cell 8633 is described as an example of a power generation means, but this does not limit the present invention. Another power generation means such as a piezoelectric element or a thermoelectric conversion element (Peltier element) may be used instead. For example, the battery may be charged with another charging means, such as a non-contact power transmission module which is capable of charging by transmitting and receiving power wirelessly (without contact), used in combination.

This embodiment can be implemented in appropriate combination with any of the structures described in the other embodiments and examples.

Embodiment 5

In this embodiment, examples of an electronic device including any of the display devices described in the above embodiments or the like are described.

Figure 7A:
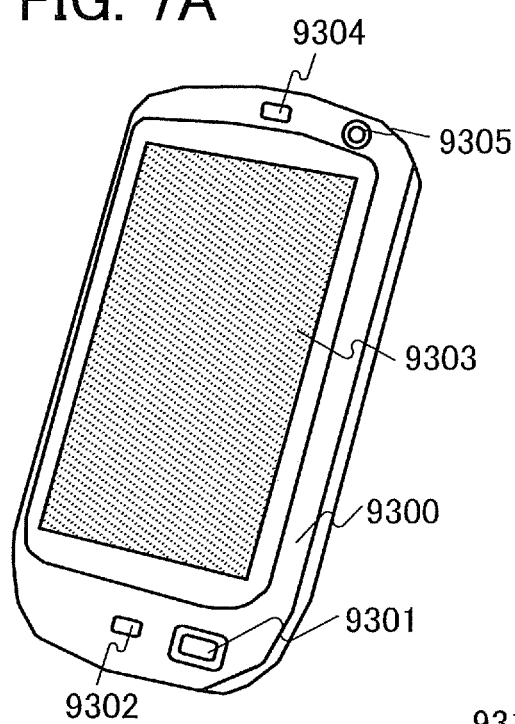
FIGS. 7A to 7C each illustrate an example of an electronic device according to one embodiment of the present invention.

FIG. 7A illustrates a portable information terminal. The portable information terminal illustrated in FIG. 7A includes a housing 9300, a button 9301, a microphone 9302, a display portion 9303, a speaker 9304, and a camera 9305, and has a function as a mobile phone. Any of the display devices and the display device with an image sensor described in the above embodiments can be applied to the display portion 9303.

Figure 7B:
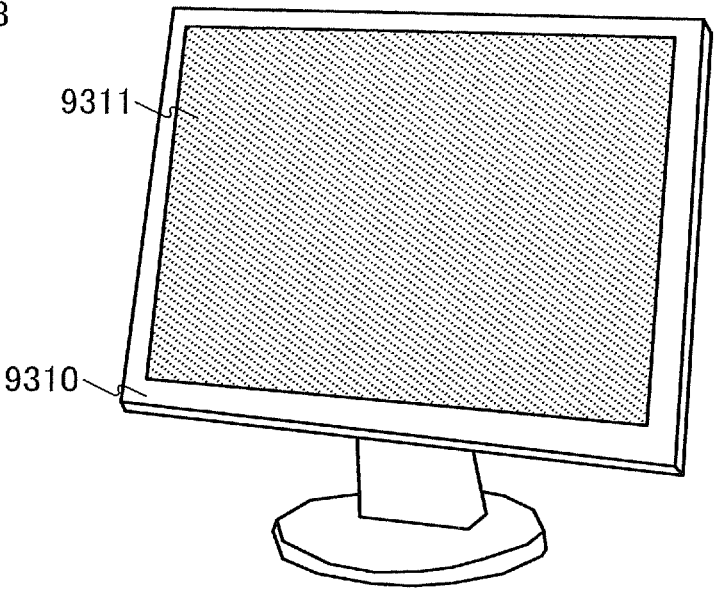

FIG. 7B illustrates a display. The display illustrated in FIG. 7B includes a housing 9310 and a display portion 9311. Any of the display devices and the display device with an image sensor which are described in the above embodiments can be applied to the display portion 9311.

Figure 7C:
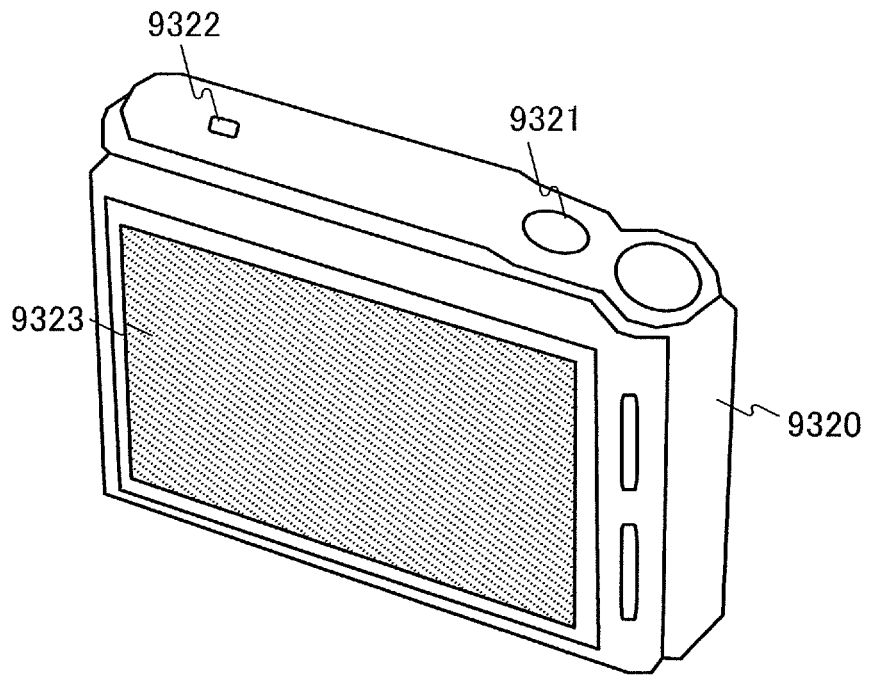

FIG. 7C illustrates a digital still camera. The digital still camera illustrated in FIG. 7C includes a housing 9320, a button 9321, a microphone 9322, and a display portion 9323. Any of the display devices and the display device with an image sensor described in the above embodiments can be applied to the display portion 9323.

By application of one embodiment of the present invention, the reliability of the electronic devices can be increased.

This embodiment can be implemented in appropriate combination with any of the structures described in the other embodiments and examples.

Example 1

In this example, a released gas from an acrylic resin which is a typical example of the organic resin that can be used for a display device was examined.

For a sample, an acrylic resin was applied onto a glass substrate, and heat treatment was performed in a nitrogen gas atmosphere at 250° C. for one hour. Note that the acrylic resin was formed so as to have a thickness of 1.5 μm after the heat treatment.

The released gas from the fabricated sample was measured by thermal desorption spectroscopy (TDS).

FIG. 8 shows the ion intensity of the released gas versus mass-to-charge ratio (also referred to as M/z) at a substrate surface temperature of 250° C. In FIG. 8, the horizontal axis represents mass-to-charge ratio and the vertical axis represents intensity (arbitrary unit). As shown in FIG. 8, a gas of an ion having a mass-to-charge ratio of 18 (an $H_2O$ gas) which seems to be due to water, a gas of an ion having a mass-to-charge ratio of 28 (a $C_2H_4$ gas), a gas of an ion having a mass-to-charge ratio of 44 (a $C_3H_8$ gas), and a gas of an ion having a mass-to-charge ratio of 56 (a $C_4H_8$ gas), which seen to be due to hydrocarbon, were detected. Note that in the vicinities of the respective mass to charge ratios, fragment ions of gases were detected.

Figure 9:
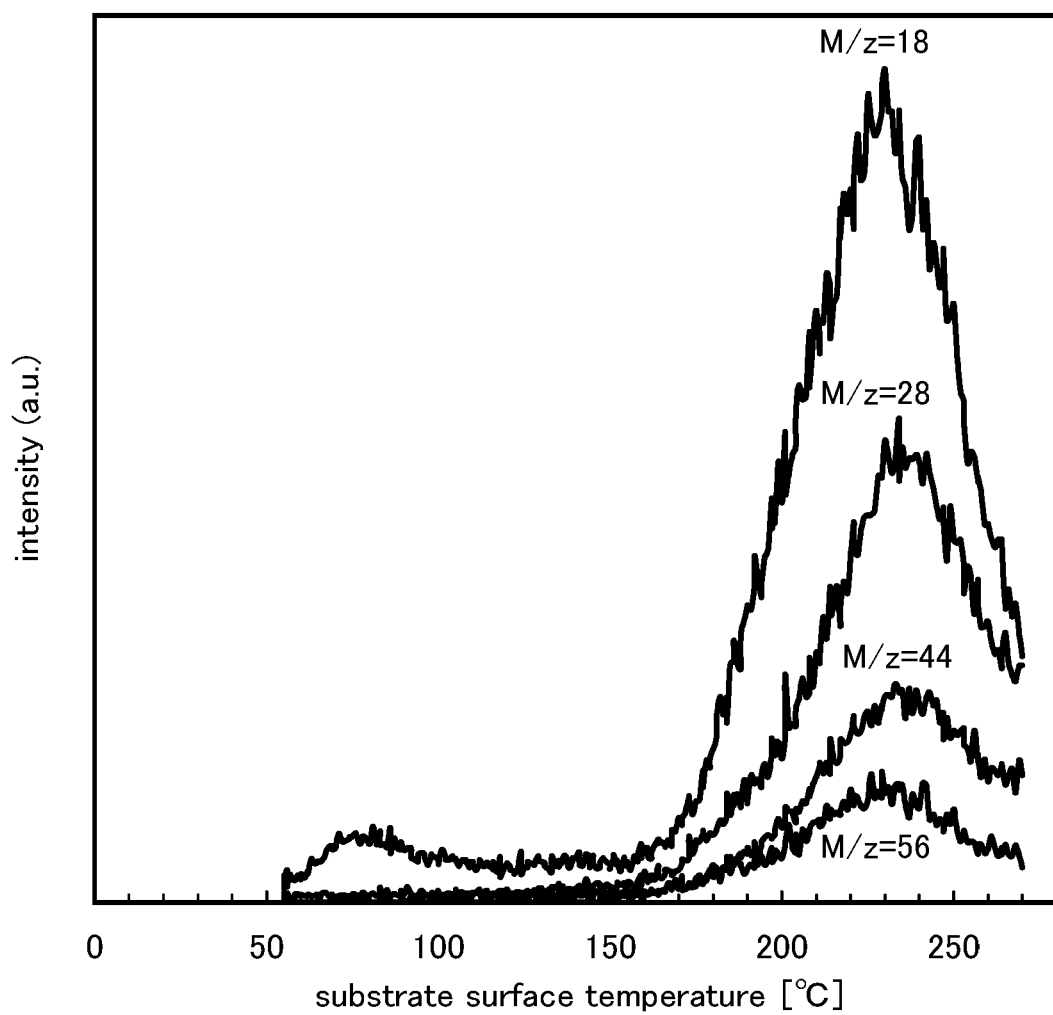
FIG. 9 shows the ion intensity versus substrate surface temperature for each mass-to-charge ratio.

FIG. 9 also shows the ion intensity versus substrate surface temperature for each mass-to-charge ratio (18, 28, 44, and 56). In FIG. 9, the horizontal axis represents substrate surface temperature (° C.) and the vertical axis represents intensity (arbitrary unit). It was found that, in the case where the substrate surface temperature was in the range from 55° C. to 270° C., the intensity of an ion having a mass-to-charge ratio of 18 which seems to be due to water had a peak in the range of greater than or equal to 55° C. and less than or equal to 100° C., and a peak in the range of greater than or equal to 150° C., and less than or equal to 270° C. In contrast, it was found that the intensities of ions having mass-to-charge ratio of 28, 44, and 56 which seem to be due to hydrocarbon each had a peak in the range of greater than or equal to 150° C., and less than or equal to 270° C.

The above showed that water, hydrocarbon, and the like, which serve as impurities in the oxide semiconductor film, were released from the organic resin. In particular, water was found to be also released at a relatively low temperature greater than or equal to 55° C. and less than or equal to 100° C. In other words, this indicated that, when an impurity due to the organic resin reached the oxide semiconductor film, electrical characteristics of the transistor might deteriorate.

The above also indicated that, when the organic resin was covered with a film that does not transmit a released gas of water, hydrocarbon, or the like (e.g. a silicon nitride film, a silicon nitride oxide film, or an aluminum oxide film), release of the gas from the organic resin increased pressure on the film that does not transmit a released gas of water, hydrocarbon, or the like, which might finally destroy the film that does not transmit a released gas of water, hydrocarbon, or the like and cause a shape defect of the transistor.

Example 2

In this example, a transistor was fabricated and a cross-sectional shape and electrical characteristics thereof were estimated.

In each sample, a bottom-gate top-contact transistor having a channel-etched structure in which an oxide semiconductor film is used is provided. The transistor includes a gate electrode provided over a glass substrate, a gate insulating film provided over the gate electrode, an oxide semiconductor film provided over the gate electrode with the gate insulating film interposed therebetween, and a pair of electrodes over and in contact with the oxide semiconductor film. Here, a tungsten film was used for the gate electrode, a silicon nitride film and a silicon oxynitride film thereover were used for the gate insulating film, and an In—Ga—Zn oxide film was used for the oxide semiconductor film. For each of the electrodes, a tungsten film, an aluminum film over the tungsten film, and a titanium film over the aluminum film were used.

The protective insulating films (a 450-nm-thick silicon oxynitride film and a 50-nm-thick silicon nitride film thereover) are provided over each of the electrodes.

In a sample of this example, a 2-μm-thick acrylic resin is provided over the protective insulating films, and a 200-nm-thick silicon nitride film is provided over the acrylic resin so as to expose part of a side surface of the acrylic resin. In a sample of a comparison example, a 1.5-μm-thick acrylic resin is provided over the protective insulating films, and a 200-nm-thick silicon nitride film is provided over the acrylic resin so as to cover the acrylic resin.

Figure 10:
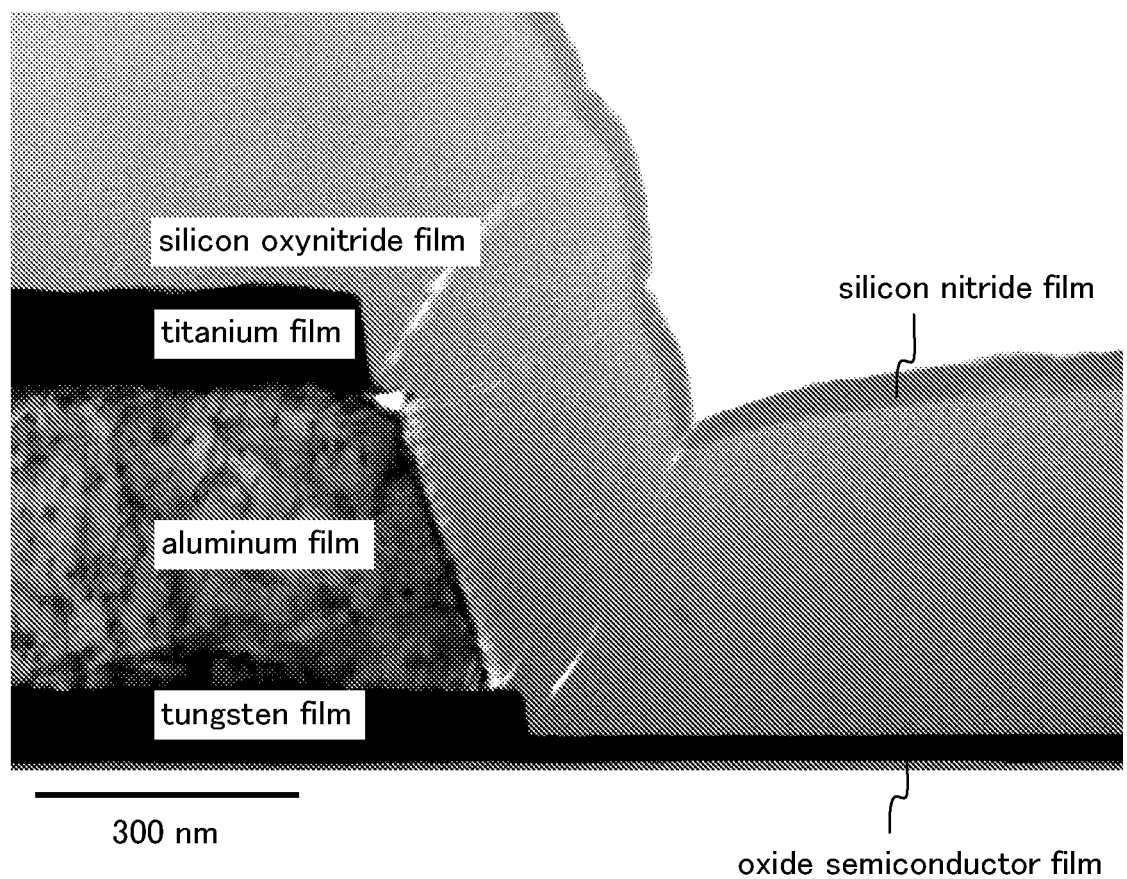
FIG. 10 illustrates a cross-sectional image of an observed sample.

FIG. 10 shows a transmitted electron image (also referred to as a TE image) of a cross-sectional shape of an enlarged part of the sample of the comparison example, which was obtained by TEM. For the observation of the cross-sectional shape, an Ultra-thin Film Evaluation System HD-2300 manufactured by Hitachi High-Technologies Corporation was used. Note that in FIG. 10, only one of the electrodes is illustrated. It is found from the electrode and the protective insulating films provided so as to cover the electrode in FIG.

10 that in the protective films, cracks are generated from a step portion formed by the electrode. Since structures of the observed regions in the sample of this example and the sample of the comparison example are substantially the same, a cross-sectional shape of the sample of this example is not shown.

Thus, the sample of this example has a structure in which a gas released from the acrylic resin is extracted to the outside of the sample, and the sample of the comparison example has a structure in which a gas released from the acrylic resin is not extracted to the outside of the sample. In other words, in the sample of the comparison example, the gas released from the acrylic resin is not extracted to the outside and enters the transistor through the crack generated in the protective insulating films.

Next, gate voltage (Vg)-drain current (Id) characteristics which are electrical characteristics of the transistors of the samples were measured. The Vg-Id characteristics were measured using the transistors each having a channel length of 3 μm and a channel width of 3 μm. Note that in the measurements of the Vg-Id characteristics, the drain voltage (Vd) was set to 1 V or 10 V and the gate voltage (Vg) was swept from −20 V to 15 V.

Figure 11A:
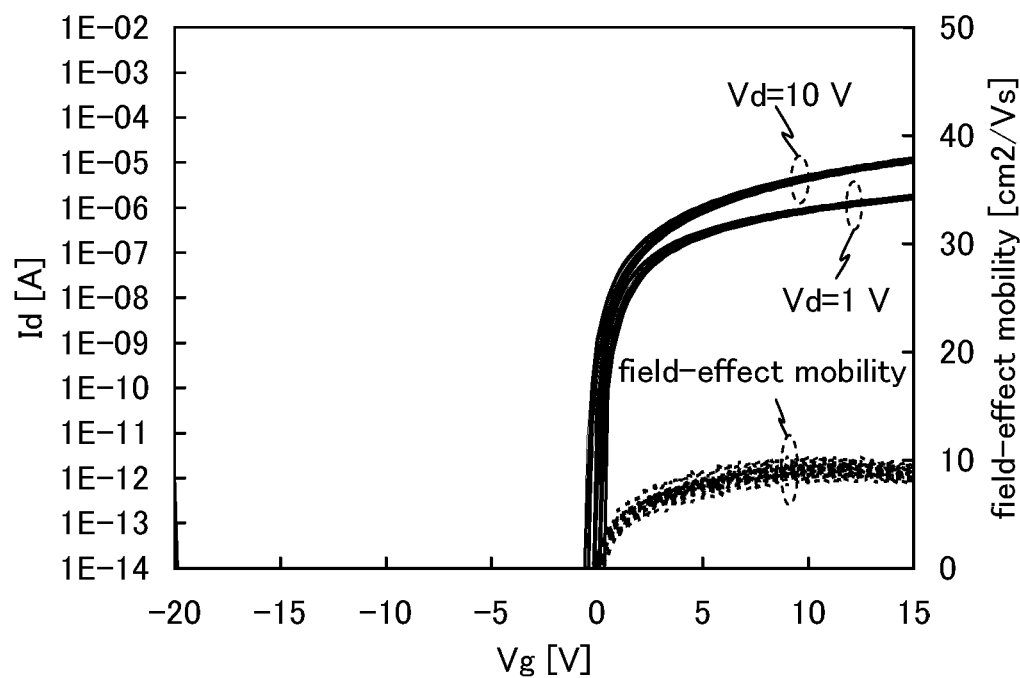
FIGS. 11A and 11B illustrate electrical characteristics of samples.
Figure 11B:
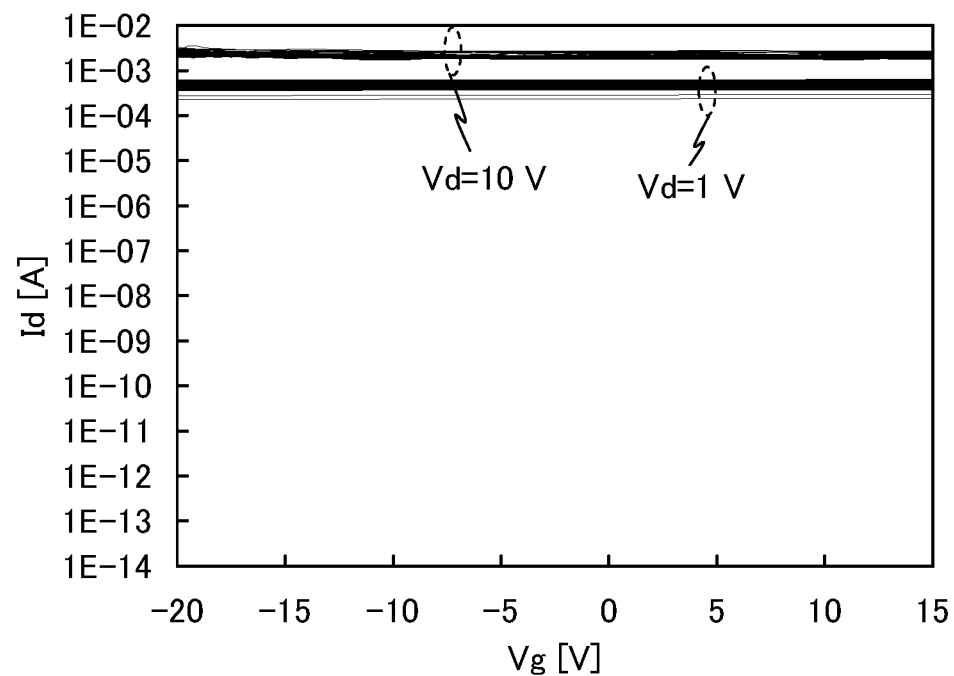

FIGS. 11A and 11B show the Vg-Id characteristics of the samples. The Vg-Id characteristics of 20 transistors over a 600 mm by 720 mm glass substrate were measured as uniformly as possible. FIG. 11A shows the Vg-Id characteristics and field-effect mobility of the transistors of the sample of this example, and FIG. 11B shows the Vg-Id characteristics of the transistors of the sample of the comparison example. Note that the field-effect mobility shown in FIG. 11A was obtained at a drain voltage (Vd) of 10 V. The field-effect mobility is not shown in FIG. 11B because it was difficult to calculate.

FIG. 11A demonstrates that the transistors of the sample of this example exhibited excellent switching characteristics. FIG. 11B shows that the transistors of the sample of the comparison example did not exhibit switching characteristics and were normally on.

Comparison with the sample of this example reveals that the deficiency of the switching characteristics of the sample of the comparison example was caused because the gas released from the acrylic resin affected the transistors. Specifically, this was probably because the gas released from the acrylic resin increased the carrier density in the oxide semiconductor film, and an electric field from the gate electrode prevented the transistors from being turned off.

This example shows that, when an organic resin is covered with a film (a 200-nm-thick silicon nitride film, here) that does not transmit released gas of water, a hydrocarbon, or the like, the gas released from the organic resin causes a deficiency of the switching characteristics of a transistor. This example also shows that, by providing a path through which the released gas is extracted to the outside of the sample in part of the film that covers the organic resin and does not transmit the released gas of water, a hydrocarbon, or the like, a deficiency of the switching characteristics of a transistor can be avoided and excellent switching characteristics can be obtained.

REFERENCE NUMERALS

101: first transistor, 102: first substrate, 103: second transistor, 104: gate electrode, 105: third transistor, 106: gate insulating film, 107: capacitor, 108: semiconductor layer, 110: source electrode, 112: drain electrode, 113: electrode, 114: first interlayer insulating film, 116: second interlayer insulating film, 118: capacitor electrode, 120: third interlayer insulating film, 122: pixel electrode, 124: first alignment film, 126: partition, 128: light-emitting layer, 130: electrode, 140: gate driver circuit portion, 142: pixel region, 144: source driver circuit portion, 146: FPC terminal portion, 148: FPC, 150: liquid crystal element, 152: second substrate, 153: colored film, 154: light-blocking film, 156: organic protective insulating film, 158: counter electrode, 160: spacer, 162: liquid crystal layer, 164: second alignment film, 166: sealant, 170: light-emitting element, 172: filler, 4001: first substrate, 4002: photodiode element, 4014: first interlayer insulating film, 4016: second interlayer insulating film, 4020: third interlayer insulating film, 4024: first alignment film, 4030: first transistor, 4032: capacitor, 4034: liquid crystal element, 1036: gate line, 4040: transistor, 4052: second substrate, 4056: transistor, 4057: gate section line, 4058: reset signal line, 1059: video signal line, 4060: second transistor, 4062: third transistor, 4071: output signal line, 4084: second alignment film, 4085: colored film, 4086: organic insulating film, 4088: counter electrode, 4096: liquid crystal layer, 5040: gate driver circuit portion, 5042: pixel region, 8033: clasp, 8034: switch, 8035: power supply switch, 8036: switch, 8038: operation switch, 8630: housing, 8631: display portion, 8631a: display portion, 8631b: display portion, 8633: solar cell, 8634: charge and discharge control circuit, 8635: battery, 8636: DCDC converter, 8637: converter, 9300: housing, 9301: button, 9302: microphone, 9303: display portion, 9304: speaker, 9305: camera, 9310: housing, 9311: display portion, 9320: housing, 9321: button, 9322: microphone, 9323: display portion.

This application is based on Japanese Patent Application serial no. 2012-161344 filed with the Japan Patent Office on Jul. 20, 2012, the entire contents of which are hereby incorporated by reference.

The invention claimed is:
1. A display device comprising:
a pixel portion comprising:
  a first transistor;
  a first insulating film over the first transistor;
  a second insulating film over and in direct contact with the first insulating film;
  a third insulating film over and in direct contact with the second insulating film; and
  a pixel electrode over the third insulating film; and
a driver circuit portion comprising:
  a second transistor;
  the first insulating film over the second transistor; and
  the second insulating film over and in direct contact with the first insulating film,
wherein the first insulating film comprises a first inorganic insulating material,
wherein the second insulating film comprises an organic insulating material,
wherein the third insulating film comprises a second inorganic insulating material,
wherein a first opening is provided in the first and second insulating films,
wherein a second opening overlapping with the first opening is provided in the third insulating film,
wherein the third insulating film comprises a region provided in a part of the first opening so as to cover an edge portion of the second insulating film, and wherein the pixel electrode is in direct contact with one of a source electrode and a drain electrode of the first transistor via the first and second openings.

2. The display device according to claim 1, wherein the first inorganic insulating material comprises any of silicon oxide, silicon oxynitride, aluminum oxide, hafnium oxide, gallium oxide, and a Ga—Zn-based metal oxide.

3. The display device according to claim 1, wherein the organic insulating material comprises any of an acrylic-based resin, a polyimide-based resin, a benzocyclobutene-based resin, a polyamide-based resin, and an epoxy-based resin.

4. The display device according to claim 1, wherein the second inorganic insulating material comprises any of silicon nitride, silicon nitride oxide, and aluminum oxide.

5. The display device according to claim 1, wherein each of the first transistor and the second transistor comprises an oxide semiconductor layer comprising indium oxide.

6. The display device according to claim 1, wherein each of the first transistor and the second transistor comprises an oxide semiconductor layer comprising any of indium oxide, tin oxide, zinc oxide, an In—Zn-based metal oxide, a Sn—Zn-based metal oxide, an Al—Zn-based metal oxide, a Zn—Mg-based metal oxide, a Sn—Mg-based metal oxide, an In—Mg-based metal oxide, an In—Ga-based metal oxide, an In—W-based metal oxide, an In—Ga—Zn-based metal oxide, an In—Al—Zn-based metal oxide, an In—Sn—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, an In—Lu—Zn-based metal oxide, an In—Sn—Ga—Zn-based metal oxide, an In—Hf—Ga—Zn-based metal oxide, an In—Al—Ga—Zn-based metal oxide, an In—Sn—Al—Zn-based metal oxide, an In—Sn—Hf—Zn-based metal oxide, and an In—Hf—Al—Zn-based metal oxide.

7. An electronic device comprising the display device according to claim 1.

8. A display device comprising:
a pixel portion comprising:
  a first transistor;
  a first insulating film over the first transistor;
  a second insulating film over and in direct contact with the first insulating film;
  a third insulating film over and in direct contact with the second insulating film;
  a pixel electrode over the third insulating film;
  an alignment film over the pixel electrode; and
  a liquid crystal layer over the alignment film; and
a driver circuit portion comprising:
  a second transistor;
  the first insulating film over the second transistor; and
  the second insulating film over and in direct contact with the first insulating film, wherein the first insulating film comprises a first inorganic insulating material,
wherein the second insulating film comprises an organic insulating material,
wherein the third insulating film comprises a second inorganic insulating material,
wherein a first opening is provided in the first and second insulating films,
wherein a second opening overlapping with the first opening is provided in the third insulating film,
wherein the third insulating film comprises a region provided in a part of the first opening so as to cover an edge portion of the second insulating film, and
wherein the pixel electrode is in direct contact with one of a source electrode and a drain electrode of the first transistor via the first and second openings.

9. The display device according to claim 8, wherein the first inorganic insulating material comprises any of silicon oxide, silicon oxynitride, aluminum oxide, hafnium oxide, gallium oxide, and a Ga—Zn-based metal oxide.

10. The display device according to claim 8, wherein the organic insulating material comprises any of an acrylic-based resin, a polyimide-based resin, a benzocyclobutene-based resin, a polyamide-based resin, and an epoxy-based resin.

11. The display device according to claim 8, wherein the second inorganic insulating material comprises any of silicon nitride, silicon nitride oxide, and aluminum oxide.

12. The display device according to claim 8, wherein each of the first transistor and the second transistor comprises an oxide semiconductor layer comprising indium oxide.

13. The display device according to claim 8, wherein each of the first transistor and the second transistor comprises an oxide semiconductor layer comprising any of indium oxide, tin oxide, zinc oxide, an In—Zn-based metal oxide, a Sn—Zn-based metal oxide, an Al—Zn-based metal oxide, a Zn—Mg-based metal oxide, a Sn—Mg-based metal oxide, an In—Mg-based metal oxide, an In—Ga-based metal oxide, an In—W-based metal oxide, an In—Ga—Zn-based metal oxide, an In—Al—Zn-based metal oxide, an In—Sn—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, an In—Lu—Zn-based metal oxide, an In—Sn—Ga—Zn-based metal oxide, an In—Hf—Ga—Zn-based metal oxide, an In—Al—Ga—Zn-based metal oxide, an In—Sn—Al—Zn-based metal oxide, an In—Sn—Hf—Zn-based metal oxide, and an In—Hf—Al—Zn-based metal oxide.

14. An electronic device comprising the display device according to claim 8.

15. A display device comprising:
a pixel portion comprising:
   a first transistor;
   a first insulating film over the first transistor;
   a second insulating film over and in direct contact with the first insulating film;
   a third insulating film over and in direct contact with the second insulating film;
   a pixel electrode over the third insulating film;
   an alignment film over the pixel electrode; and
   a liquid crystal layer over the alignment film; and
a driver circuit portion comprising:
   a second transistor;
   the first insulating film over the second transistor; and
   the second insulating film over and in direct contact with the first insulating film,
wherein the first insulating film comprises silicon nitride,
wherein the second insulating film comprises an organic insulating material,
wherein the third insulating film comprises silicon nitride,
wherein a first opening is provided in the first and second insulating films,
wherein a second opening overlapping with the first opening is provided in the third insulating film,
wherein the third insulating film comprises a region provided in a part of the first opening so as to cover an edge portion of the second insulating film, and
wherein the pixel electrode is in direct contact with one of a source electrode and a drain electrode of the first transistor via the first and second openings.

16. The display device according to claim 15,
wherein the organic insulating material comprises any of an acrylic-based resin, a polyimide-based resin, a benzocyclobutene-based resin, a polyamide-based resin, and an epoxy-based resin.

17. The display device according to claim 15,
wherein each of the first transistor and the second transistor comprises an oxide semiconductor layer comprising indium oxide.

18. The display device according to claim 15,
wherein each of the first transistor and the second transistor comprises an oxide semiconductor layer comprising any of indium oxide, tin oxide, zinc oxide, an In—Zn-based metal oxide, a Sn—Zn-based metal oxide, an Al—Zn-based metal oxide, a Zn—Mg-based metal oxide, a Sn—Mg-based metal oxide, an In—Mg-based metal oxide, an In—Ga-based metal oxide, an In—W-based metal oxide, an In—Ga—Zn-based metal oxide, an In—Al—Zn-based metal oxide, an In—Sn—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, an In—Lu—Zn-based metal oxide, an In—Sn—Ga—Zn-based metal oxide, an In—Hf—Ga—Zn-based metal oxide, an In—Al—Ga—Zn-based metal oxide, an In—Sn—Al—Zn-based metal oxide, an In—Sn—Hf—Zn-based metal oxide, and an In—Hf—Al—Zn-based metal oxide.

19. An electronic device comprising the display device according to claim 15.

* * * * *